United States Patent
Zhu

(10) Patent No.: US 12,176,393 B2
(45) Date of Patent: Dec. 24, 2024

(54) NANOWIRE/NANOSHEET DEVICE WITH SUPPORT PORTION, METHOD OF MANUFACTURING THE SAME, AND ELECTRONIC APPARATUS

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 435 days.

(21) Appl. No.: 17/729,232

(22) Filed: Apr. 26, 2022

(65) Prior Publication Data

US 2022/0367628 A1 Nov. 17, 2022

(30) Foreign Application Priority Data

Apr. 29, 2021 (CN) .......................... 202110477578.6

(51) Int. Cl.
*H01L 29/06* (2006.01)
*H01L 21/8234* (2006.01)
(Continued)

(52) U.S. Cl.
CPC .. *H01L 29/0673* (2013.01); *H01L 21/823412* (2013.01); *H01L 21/823418* (2013.01);
(Continued)

(58) Field of Classification Search
CPC ......... H01L 29/66545; H01L 29/66439; H01L 29/0673; H01L 29/42392; H01L 29/775;
(Continued)

(56) References Cited

U.S. PATENT DOCUMENTS

2013/0270512 A1* 10/2013 Radosavljevic .... H01L 27/1211
438/212
2018/0114727 A1* 4/2018 Rodder ........... H01L 21/823828
(Continued)

FOREIGN PATENT DOCUMENTS

CN 103857437 A 6/2014
JP 2007088482 A 4/2007

OTHER PUBLICATIONS

First Office Action for Chinese Application No. 202110477578.6, Dated Dec. 29, 2023, 11 pages including English Translation.

*Primary Examiner* — Mohsen Ahmadi
(74) *Attorney, Agent, or Firm* — Christopher R. Christenson; Kelly, Holt & Christenson, P.L.L.C.

(57) ABSTRACT

Provided are a nanowire/nanosheet device with a support portion, a method of manufacturing the same, and an electronic apparatus including the nanowire/nanosheet device. According to the embodiments, the nanowire/nanosheet device may include: a substrate; a first source/drain layer and a second source/drain layer opposite to each other in a first direction on the substrate; a first nanowire/nanosheet and a second nanowire/nanosheet, wherein the first nanowire/nanosheet and the second nanowire/nanosheet are spaced apart from a surface of the substrate, the first nanowire/nanosheet and the second nanowire/nanosheet extend from the first source/drain layer to the second source/drain layer, respectively, and are arranged adjacent to each other in a direction parallel to the surface of the substrate; a first support portion connected between the first nanowire/nanosheet and the second nanowire/nanosheet; and a gate stack extending in a second direction intersecting the first direction to surround the first nanowire/nanosheet and the second nanowire/nanosheet.

16 Claims, 17 Drawing Sheets

(51) Int. Cl.
*H01L 29/10* (2006.01)
*H01L 29/165* (2006.01)
*H01L 29/423* (2006.01)
*H01L 29/66* (2006.01)
*H01L 29/775* (2006.01)
*H01L 29/78* (2006.01)
*H01L 29/786* (2006.01)

(52) U.S. Cl.
CPC ........ *H01L 21/823468* (2013.01); *H01L 21/823481* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC ........... H01L 29/78696; H01L 29/1079; H01L 29/165; H01L 29/7848
See application file for complete search history.

(56) References Cited

U.S. PATENT DOCUMENTS

2020/0098879 A1* 3/2020 Lee .................. H01L 29/66287
2021/0083127 A1  3/2021 Xie et al.
2022/0130822 A1* 4/2022 Chiu .................... H01L 27/088

* cited by examiner

NANOWIRE/NANOSHEET DEVICE WITH SUPPORT PORTION, METHOD OF MANUFACTURING THE SAME, AND ELECTRONIC APPARATUS

CROSS REFERENCE

This application claims the benefit of Chinese Patent Application No. 202110477578.6, filed on Apr. 29, 2021 in the China National Intellectual Property Administration, the whole disclosure of which is incorporated herein by reference in its entirety.

TECHNICAL FIELD

The present disclosure relates to a field of semiconductors, in particular to a nanowire/nanosheet device with a support portion, a method of manufacturing the nanowire/nanosheet device, and an electronic apparatus including the nanowire/nanosheet device.

BACKGROUND

A nanowire or nanosheet (hereinafter referred to as "nanowire/nanosheet") device, especially a nanowire/nanosheet-based Gate-All-Around (GAA) Metal Oxide Semiconductor Field Effect Transistor (MOSFET), may control a short channel effect well and achieve a further miniaturization of the device. However, with an increasing miniaturization, it is difficult to avoid an adhesion of nanowires/nanosheets during a manufacturing process.

SUMMARY

In view of this, an objective of the present disclosure is at least partially to provide a nanowire/nanosheet device with a support portion, a method of manufacturing the same, and an electronic apparatus including the nanowire/nanosheet device.

According to an aspect of the present disclosure, there is provided a nanowire/nanosheet device, including: a substrate; a first source/drain layer and a second source/drain layer opposite to each other in a first direction on the substrate; a first nanowire/nanosheet and a second nanowire/nanosheet, wherein the first nanowire/nanosheet and the second nanowire/nanosheet are spaced apart from a surface of the substrate, the first nanowire/nanosheet and the second nanowire/nanosheet extend from the first source/drain layer to the second source/drain layer, respectively, and are arranged adjacent to each other in a direction parallel to the surface of the substrate; a first support portion connected between the first nanowire/nanosheet and the second nanowire/nanosheet; and a gate stack extending in a second direction to surround the first nanowire/nanosheet and the second nanowire/nanosheet, wherein the second direction intersects the first direction.

According to another aspect of the present disclosure, there is provided a method of manufacturing a nanowire/nanosheet device, including: forming a nanowire/nanosheet defining layer on a substrate, wherein the nanowire/nanosheet defining layer is spaced apart from the substrate; forming a first source/drain layer and a second source/drain layer on two opposite sides of the nanowire/nanosheet defining layer in a first direction, wherein the first source/drain layer and the second source/drain layer are connected to the nanowire/nanosheet defining layer; patterning the nanowire/nanosheet defining layer into a pattern comprising: a first nanowire/nanosheet and a second nanowire/nanosheet extending from the first source/drain layer to the second source/drain layer, respectively, and a first support portion connected between the first nanowire/nanosheet and the second nanowire/nanosheet; and forming a gate stack on the substrate, wherein the gate stack extends in a second direction intersecting the first direction and surrounds the first nanowire/nanosheet and the second nanowire/nanosheet.

According to another aspect of the present disclosure, there is provided an electronic apparatus including the nanowire/nanosheet device described above.

According to the embodiments of the present disclosure, a support portion may be provided between the nanowires/nanosheets to prevent the nanowires/nanosheets from adhering to each other during a manufacturing process, especially in a case of a gate length greater than 50 nm.

BRIEF DESCRIPTION OF THE DRAWINGS

The above and other objectives, features, and advantages of the present disclosure will be clearer through the following descriptions of embodiments of the present disclosure with reference to the drawings.

FIG. 1 to FIG. 16(d) show schematic diagrams of some stages in a process of manufacturing a nanowire/nanosheet device according to the embodiments of the present disclosure, in which:

FIG. 15(d) and FIG. 16(d) are cross-sectional views taken along the line DD'.

Throughout the drawings, the same or similar reference numerals represent the same or similar components.

DETAILED DESCRIPTION OF EMBODIMENTS

Figure 1:
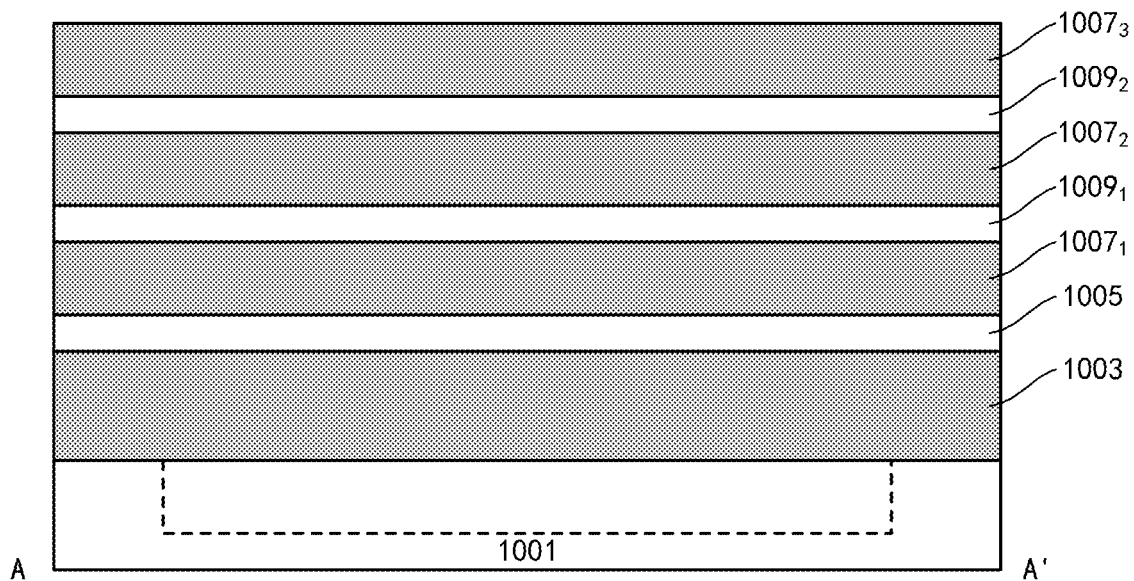

Hereinafter, the embodiments of the present disclosure will be described with reference to the drawings. However, it should be understood that these descriptions are only exemplary, and are not intended to limit the scope of the present disclosure. Moreover, in the following descriptions, descriptions of well-known structures and technologies are omitted to avoid unnecessarily obscuring the concept of the present disclosure.

Various schematic structural diagrams according to the embodiments of the present disclosure are shown in the drawings. The drawings are not drawn to scale. Some details are enlarged and some details may be omitted for clarity of presentation. Shapes of the various regions, layers and a relative size and a positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being located "on" another layer/element, the layer/element may be directly on the another layer/element, or there may be an intermediate layer/element therebetween. In addition, if a layer/element is located "on" another layer/element in one orientation, the layer/element may be located "under" the another layer/element when the orientation is reversed.

According to the embodiments of the present disclosure, there is provided a nanowire/nanosheet device. In particular, the device may include one or more nanowires or nanosheets used as a channel. The nanowire/nanosheet may be suspended with respect to a substrate and may extend substantially parallel to a surface of the substrate. The nanowire/nanosheet may extend in a first direction between source/drain layers opposite to each other. The source/drain layer may contain a semiconductor material different from that of the nanowire/nanosheet in order to achieve stress engineering. In addition, a gate stack may extend in a second direction intersecting (e.g., perpendicular to) the first direction so as to intersect each nanowire/nanosheet, and thus may surround a periphery of each nanowire/nanosheet, so that a Gate-All-Around (GAA) structure may be formed.

According to the embodiments of the present disclosure, a support portion may be provided between adjacent nanowires/nanosheets, in particular between nanowires/nanosheets adjacent in a lateral direction (e.g., in a direction substantially parallel to the surface of the substrate), to inhibit an adhesion of the nanowires/nanosheets during a manufacturing process. In addition, the nanowires/nanosheets at different heights in a vertical direction (e.g., a direction substantially perpendicular to the substrate surface) may be substantially aligned, and the support portions at different heights may also be substantially aligned.

The nanowires/nanosheets adjacent in the lateral direction may be obtained from one same semiconductor layer (also referred to as a "nanowire/nanosheet defining layer"), and thus may be substantially coplanar. In addition, the support portion between the nanowires/nanosheets may also be obtained from the semiconductor layer, and thus the support portion may be substantially coplanar and integral with the nanowires/nanosheets. That is, the nanowires/nanosheets and the support portion therebetween as a whole may be the same semiconductor layer, and an opening may be formed in the semiconductor layer so as to define the nanowires/nanosheets and the support portion used as the channel.

Such a semiconductor device may be manufactured, for example, as follows. One or more nanowire/nanosheet defining layers (spaced apart from each other in a case of a plurality of nanowire/nanosheet defining layers) spaced apart from the substrate may be provided on the substrate. Device manufacturing may be performed based on the nanowire/nanosheet defining layer. For example, a dummy gate may be formed, and a spacer may be formed on a sidewall of the dummy gate. An end of the nanowire/nanosheet defining layer may be exposed through the spacer. A source/drain layer connected to the nanowire/nanosheet defining layer may be formed at the end of the nanowire/nanosheet defining layer. The dummy gate may be replaced with a gate stack by a replacement gate process. According to the embodiments of the present disclosure, after the dummy gate is removed in the replacement gate process, the nanowire/nanosheet defining layer may be patterned into two or more designed nanowires/nanosheets and a support portion therebetween. After that, a gate stack may be formed in a gate trench left on an inner side of the spacer by a removal of the dummy gate, and the gate stack may surround the nanowires/nanosheets (and the support portion therebetween).

In order to provide the nanowire/nanosheet defining layer spaced apart from the substrate, a stack of alternately arranged one or more gate defining layers and one or more nanowire/nanosheet defining layers may be formed on the substrate. In addition, an isolation portion defining layer may be provided below the stack in consideration of an electrical isolation. The gate defining layer, the nanowire/nanosheet defining layer and the isolation portion defining layer may be formed on the substrate by an epitaxial growth. The stack may be patterned to extend in the first direction. The isolation portion defining layer may also be patterned in the patterning step, and the isolation portion defining layer may be self-aligned with the nanowire/nanosheet defining layer. So far, the gate defining layer also has a shape extending in the first direction. In order to form an all-around gate, another gate defining layer may be further formed and patterned into a strip shape extending in the second direction. The strip-shaped another gate defining layer may be used as a mask to pattern the nanowire/nanosheet defining layer and the gate defining layer under the another gate defining layer. The strip-shaped another gate defining layer together with other gate defining layers may constitute a dummy gate extending in the second direction, and the nanowire/nanosheet defining layer may be patterned to be self-aligned with the dummy gate and surrounded by the dummy gate. The isolation portion defining layer may also be patterned in the patterning step, and the isolation portion defining layer may be self-aligned with the nanowire/nanosheet defining layer.

In order to form a self-aligned spacer, the dummy gate may be selectively etched so that a sidewall of the dummy gate is recessed inwardly with respect to a sidewall of the nanowire/nanosheet, and the spacer may be formed in a recess thus formed.

The present disclosure may be presented in various forms, some examples of which will be described below. In the following descriptions, a selection of various materials is involved. In the selection of the material, in addition to a function of the material (for example, a semiconductor material may be used for forming an active region, a dielectric material may be used for forming an electrical isolation, and a conductive material may be used for forming an electrode, an interconnect structure, etc.), an etching selectivity is also considered. In the following descriptions, a required etching selectivity may or may not be indicated. It should be clear to those skilled in the art that when etching a material layer is mentioned below, if it is not mentioned or shown that other layers are also etched, then the etching may be selective, and the material layer may have etching selectivity relative to other layers exposed to the same etching recipe.

FIG. 1 to FIG. 16(d) show schematic diagrams of some stages in a process of manufacturing a nanowire/nanosheet device according to the embodiments of the present disclosure.

As shown in FIG. 1, a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for ease of explanation, a bulk Si substrate such as a Si wafer is taken as an example for description.

A well region as indicated by a dotted line in FIG. 1 may be formed in the substrate 1001. For example, if an n-type device is to be formed on the substrate 1001, a p-type doped well region may be formed; and if a p-type device is to be formed on the substrate 1001, an n-type doped well region may be formed. A doping concentration of the well region may be about 1E17-1E 19 $cm^{-3}$.

An isolation portion defining layer 1003 may be formed on the substrate 1001 to define a position of an isolation portion to be subsequently formed. An etch stop layer 1005 may be formed on the isolation portion defining layer 1003. The etch stop layer 1005 may set a stop position when the isolation portion defining layer 1003 is subsequently etched, especially in a case that the isolation portion defining layer 1003 having no etching selectivity or low etching selectivity relative to gate defining layers (e.g., $\mathbf{1007_1}$, $\mathbf{1007_2}$, $\mathbf{1007_3}$) subsequently formed. Alternatively, the etch stop layer 1005 may be omitted in a case that the isolation portion defining layer 1003 has etching selectivity relative to the gate defining layers subsequently formed.

A stack of alternately arranged gate defining layers $\mathbf{1007_1}$, $\mathbf{1007_2}$, $\mathbf{1007_3}$ and nanowire/nanosheet defining layers $\mathbf{1009_1}$, $\mathbf{1009_2}$ may be formed on the etch stop layer 1005. The gate defining layers $\mathbf{1007_1}$, $\mathbf{1007_2}$, $\mathbf{1007_3}$ may be used to define a position of a gate stack to be subsequently formed, and the nanowire/nanosheet defining layers $\mathbf{1009_1}$, $\mathbf{1009_2}$ may be used to define a position of a nanowire/nanosheet to be subsequently formed. An uppermost layer in the stack may be the gate defining layer $\mathbf{1007_3}$, so that the nanowire/nanosheet defining layers $\mathbf{1009_1}$, $\mathbf{1009_2}$ may be covered by the gate defining layers on top and bottom, so that a gate-all-around configuration may be subsequently formed. In this example, two nanowire/nanosheet defining layers $\mathbf{1009_1}$, $\mathbf{1009_2}$ may be formed, and thus two layers of nanowires/nanosheets may be formed in a final device. However, the present disclosure is not limited to this. The number of nanowire/nanosheet defining layers to be formed may be determined, and the number of gate defining layers to be formed may be determined correspondingly, based on the number of layers (which may be one or more) of nanowires/nanosheets to be finally formed.

The isolation portion defining layer 1003, the etch stop layer 1005, the gate defining layers $\mathbf{1007_1}$, $\mathbf{1007_2}$, $\mathbf{1007_3}$ and the nanowire/nanosheet defining layers $\mathbf{1009_1}$, $\mathbf{1009_2}$ may be semiconductor layers formed on the substrate 1001 by, for example, epitaxial growth. The nanowire/nanosheet defining layers $\mathbf{1009_1}$, $\mathbf{1009_2}$ may then have a good crystalline quality and may be of a single crystalline structure, so as to subsequently provide a single crystalline nanowire/nanosheet used as a channel. Adjacent semiconductor layers of the semiconductor layers may have etching selectivity with each other, so as to be subsequently processed differently. For example, the etch stop layer 1005 and the nanowire/nanosheet defining layers $\mathbf{1009_1}$, $\mathbf{1009_2}$ may contain Si, and the isolation portion defining layer 1003 and the gate defining layers $\mathbf{1007_1}$, $\mathbf{1007_2}$, $\mathbf{1007_3}$ may contain SiGe (an atomic percentage of Ge is, for example, about 10% to 40%, and may be gradually changed to reduce defects). Each semiconductor layer may have a substantially uniform thickness, so as to extend substantially parallel to a surface of the substrate 1001. For example, a thickness of the isolation portion defining layer 1003 may be about 30 nm to 80 nm, a thickness of the etch stop layer 1005 may be about 3 nm to 15 nm, a thickness of the nanowire/nanosheet defining layers $\mathbf{1009_1}$, $\mathbf{1009_2}$ may be about 5 nm to 15 nm, a thickness of the gate defining layer $\mathbf{1007_1}$ may be about 30 nm to 80 nm, a thickness of the gate defining layer $\mathbf{1007_2}$ may be about 20 nm to 40 nm, and a thickness of the gate defining layer $\mathbf{1007_3}$ may be about 30 nm to 50 nm. Here, the gate defining layer $\mathbf{1007_2}$ between the nanowire/nanosheet defining layers $\mathbf{1009_1}$ and $\mathbf{1009_2}$ may be relatively thin, and the gate defining layer $\mathbf{1007_3}$ on an upper side of the nanowire/nanosheet defining layer $\mathbf{1009_2}$ and the gate defining layer $\mathbf{1007_1}$ on a lower side of the nanowire/nanosheet defining layer $\mathbf{1009_1}$ may be relatively thick.

Figure 2A:
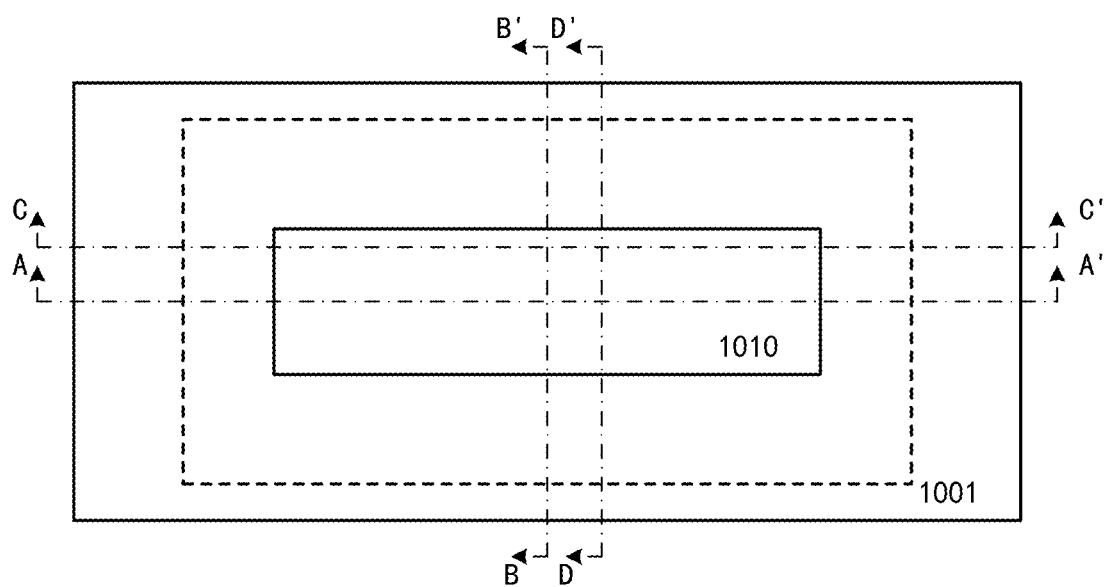
FIG. 2(a), FIG. 4(a), FIG. 14(a), FIG. 14(b) and FIG. 14(c) are top views, and positions of lines AA', BB', CC', DD' are shown in FIG. 2(a), FIG. 1, FIG. 2(b), FIG. 3(a), FIG. 4(b), FIG. 5, FIG. 6, FIG. 7(a), FIG. 8, FIG. 9(a), FIG. 10(a), FIG. 11(a), FIG. 12(a), FIG. 13(a), FIG. 15(a) and FIG. 16(a) are cross-sectional views taken along the line AA'.
Figure 2B:
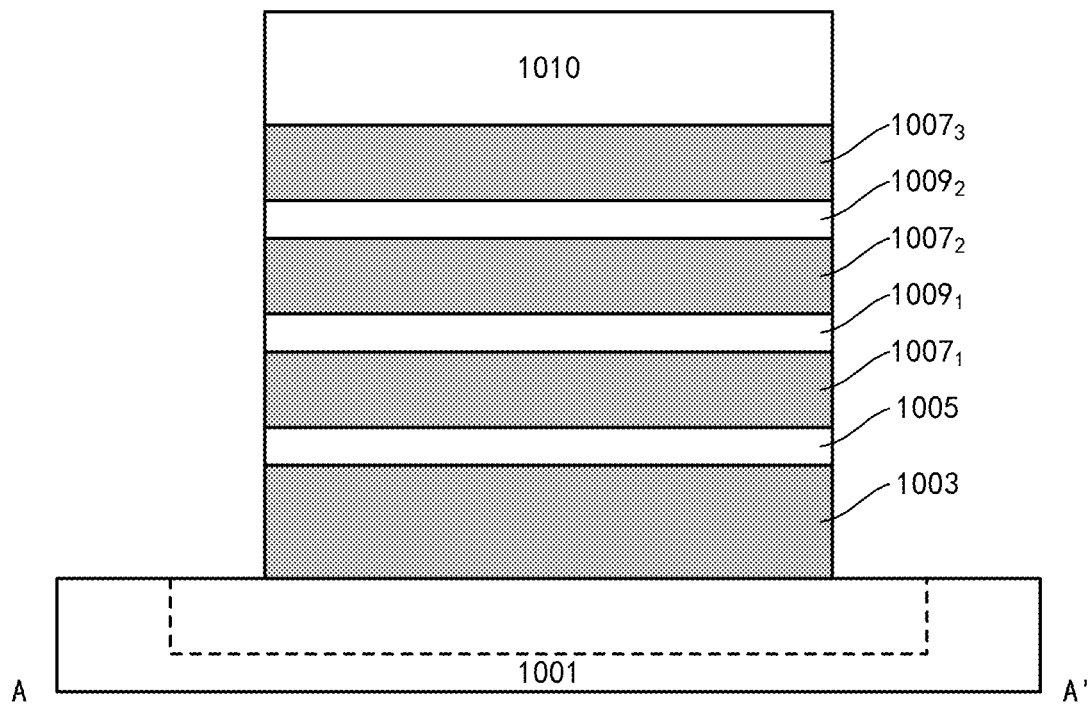
Figure 2C:
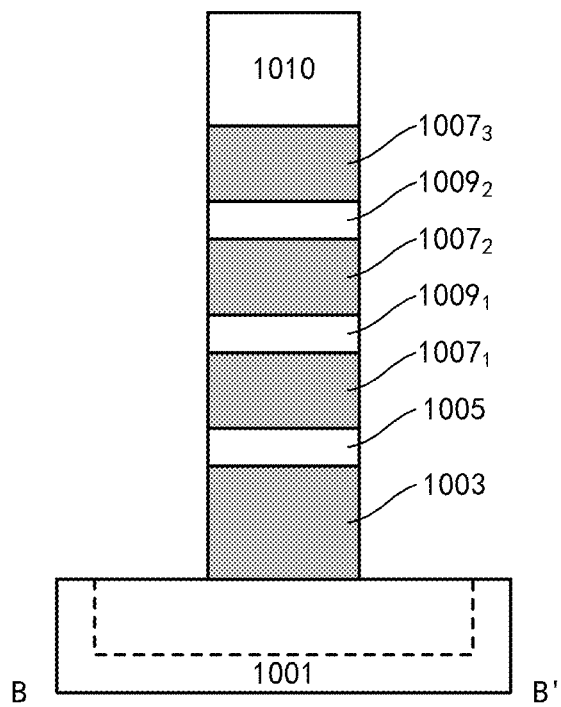
FIG. 2(c), FIG. 3(b), FIG. 7(b), FIG. 9(b), FIG. 10(b), FIG. 11(b), FIG. 12(b), FIG. 13(b), FIG. 15(b) and FIG. 16(b) are cross-sectional views taken along the line BB'.

Next, a nanowire/nanosheet may be patterned. For example, as shown in FIG. 2(*a*), FIG. 2(*b*) and FIG. 2(*c*), a mask such as a photoresist 1010 may be formed on the above-mentioned stack, and the photoresist 1010 may be patterned into a sheet or wire shape by photolithography. A pattern of the photoresist 1010 may be determined according to a shape and a size of a finally desired channel to be formed, which will be apparent according to the following descriptions. Then, by using the photoresist 1010 as a mask, each layer on the substrate 1001 may be selectively etched sequentially by, for example, Reactive Ion Etching (RIE), and the etching may stop at the substrate 1001. The RIE may be performed in a vertical direction. In this way, each layer on the substrate 1001 may be patterned into a preliminary nanowire or nanosheet corresponding to the photoresist 1010. After that, the photoresist 1010 may be removed.

Figure 3A:
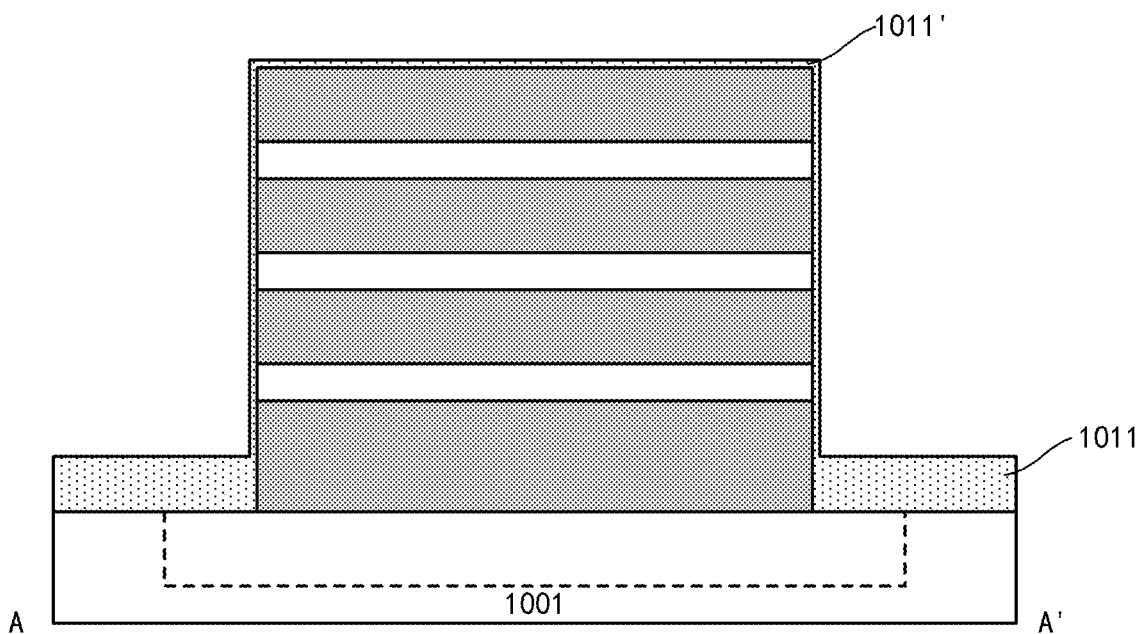
Figure 3B:
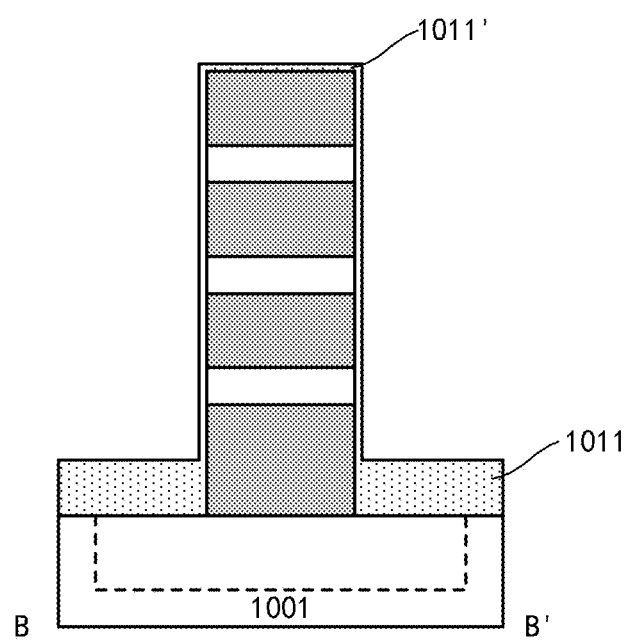

For the purpose of electrical isolation, as shown in FIG. 3(*a*) and FIG. 3(*b*), an isolation portion 1011, such as a Shallow Trench Isolation (STI), may be formed on the substrate 1001. For example, the STI 1011 may be formed by depositing an oxide (e.g., silicon oxide) on the substrate, performing a planarization process such as Chemical Mechanical Polishing (CMP) on the deposited oxide, and etching back the planarized oxide by, for example, a wet etching or a vapor phase etching or a dry etching. In addition, on a surface of the semiconductor layer patterned into the nanowire/nanosheet form on the substrate 1001, a thin etch stop layer 1011' (e.g., with a thickness of about 1 nm to 5 nm) may be formed by, for example, deposition. Here, the etch stop layer 1011' may also contain an oxide, and is thus shown as a thin layer integral with the STI 1011.

Figure 4A:
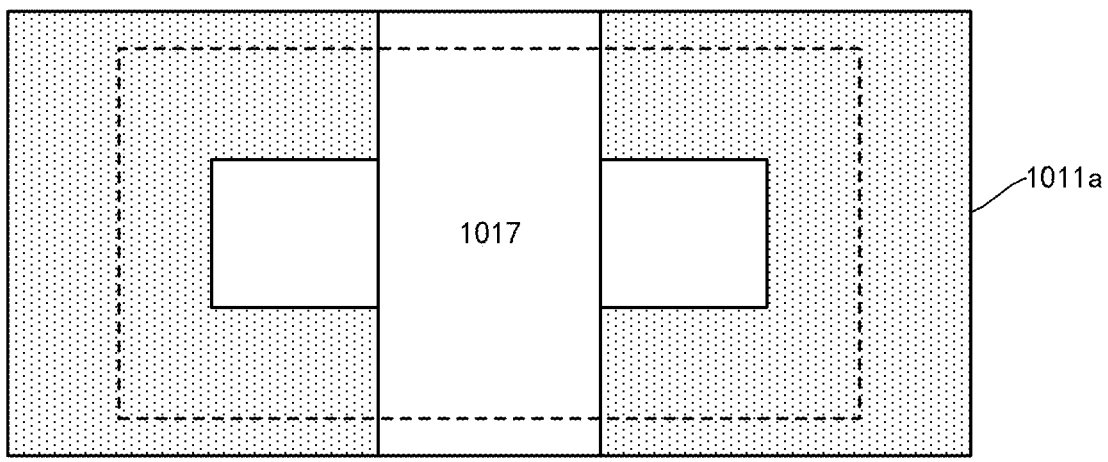

As described above, the gate defining layers $\mathbf{1007_1}$, $\mathbf{1007_2}$, $\mathbf{1007_3}$ are located on the upper and lower sides of the nanowire/nanosheet defining layers $\mathbf{1009_1}$, $\mathbf{1009_2}$. In order to form the gate-all-around, another gate defining layer may be formed on left and right sides in an orientation shown in FIG. 3(*b*). For example, as shown in FIG. 4(*a*) and FIG. 4(*b*), a gate defining layer 1013 may be formed on the STI 1011 and the etch stop layer 1011'. For example, the gate defining layer 1013 may be formed by depositing substantially the same or similar material as the gate defining layers $\mathbf{1007_1}$, $\mathbf{1007_2}$, $\mathbf{1007_3}$ (thereby having substantially the same or similar etching selectivity, so as to be processed together) and performing a planarization processing such as CMP on the deposited material. In the example, the gate defining layer 1013 may contain SiGe with an atomic percentage of Ge substantially the same as or similar to that of the gate defining layers $\mathbf{1007_1}$, $\mathbf{1007_2}$, $\mathbf{1007_3}$.

A hard mask layer 1015 may be formed on the gate defining layer 1013 by, for example, deposition, to facilitate patterning. For example, the hard mask layer 1015 may contain a nitride (e.g., silicon nitride).

The gate defining layers $\mathbf{1007_1}$, $\mathbf{1007_2}$, $\mathbf{1007_3}$, 1013 may be patterned into a dummy gate extending in a direction (e.g., a vertical direction on a paper surface in FIG. 4(*a*)) intersecting (e.g., perpendicular to) an extension direction (e.g., a horizontal direction on the paper surface in FIG. 4(*a*)) of the preliminary nanowire/nanosheet. For example, a photoresist 1017 may be formed on the hard mask layer 1015, and the photoresist 1017 may be patterned into a strip shape extending in the direction by photolithography. Then, each layer surrounded by the STI 1011 on the substrate 1001 may be selectively etched sequentially by, for example, RIE, with the photoresist 1017 as a mask, and the etching may stop at the substrate 1001. As a result, the gate defining layers $1007_1$, $1007_2$, $1007_3$, 1013 may be strip-shaped as a whole, and may be collectively referred to as the "dummy gate". The dummy gate may surround a periphery of each nanowire/nanosheet defining layer $1009_1$, $1009_2$ so that a gate-all-around structure may be subsequently formed. The nanowire/nanosheet defining layers $1009_1$, $1009_2$ may be self-aligned with the dummy gate. After that, the photoresist 1017 may be removed.

Figure 4B:
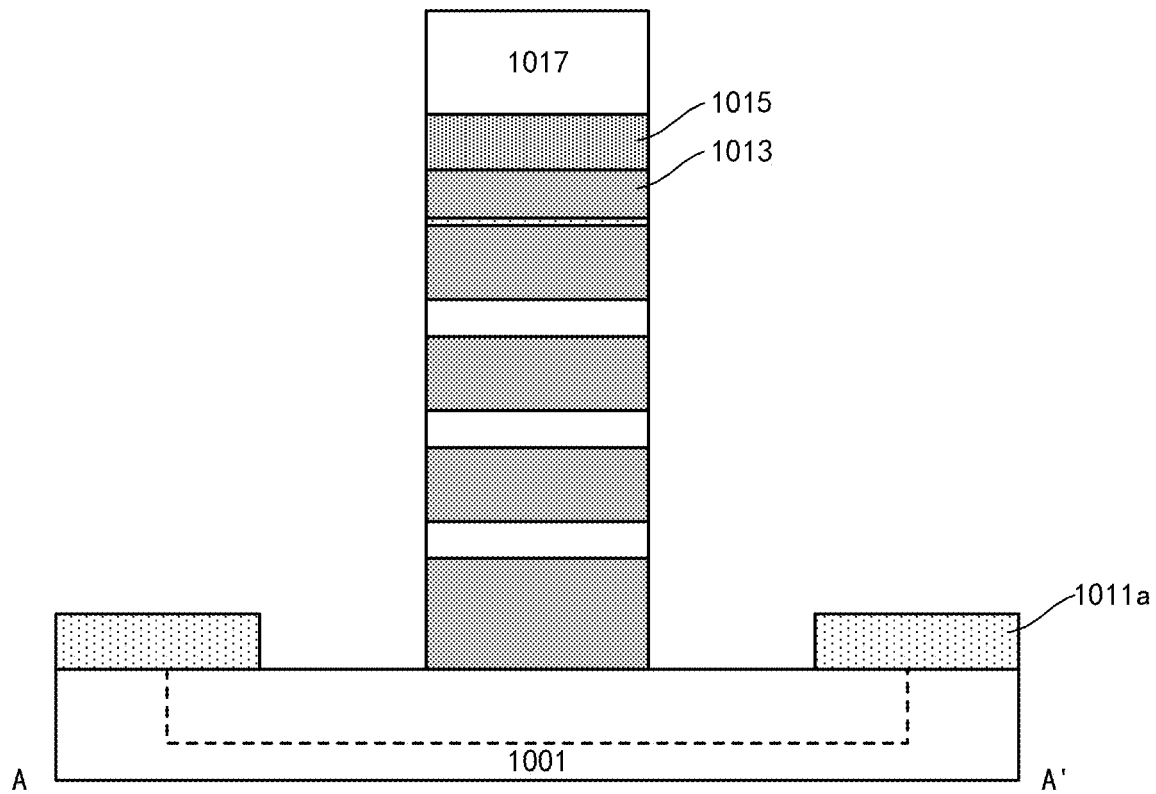

In addition, as shown in FIG. 4(b), on two sides of the dummy gate, a left STI 1011a exposes the surface of the substrate 1001, and the exposed surface may facilitate a subsequent growth of the source/drain layer. In addition, on two opposite sides of the isolation portion defining layer 1003 in an extension direction of the dummy gate (a direction perpendicular to the paper surface in FIG. 4(b)), the STI 1011a may be connected to the isolation portion defining layer 1003 and may extend in self-alignment with the dummy gate (referring to FIG. 7(b)).

Figure 5:
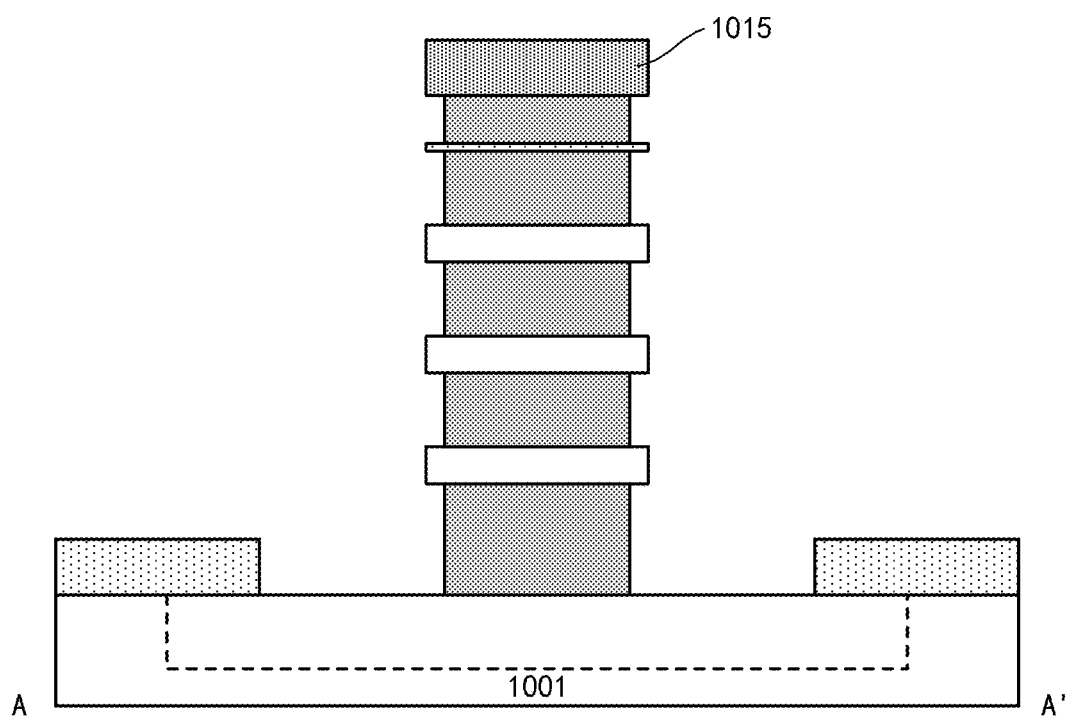

In consideration of a limitation of a gate space and an isolation between the gate and the source/drain, a spacer may be formed on a sidewall of the dummy gate. In order to ensure identical gate lengths above and below each nanowire/nanosheet defining layer $1009_1$, $1009_2$, the spacer may be formed by using a self-alignment technology. For example, as shown in FIG. 5, the gate defining layers $1007_1$, $1007_2$, $1007_3$, 1013 (SiGe in the example) may be selectively etched relative to the nanowire/nanosheet defining layers $1009_1$, $1009_2$ (Si in the example), so that sidewalls of the gate defining layers $1007_1$, $1007_2$, $1007_3$, 1013 are recessed laterally by a depth of, for example, about 3 nm to 25 nm, with respect to a sidewall of the hard mask layer 1015 or sidewalls of the nanowire/nanosheet defining layers $1009_1$, $1009_2$. The recessed depths of the gate defining layers $1007_1$, $1007_2$, $1007_3$, 1013 may be substantially the same, and the recessed depths at left and right sides may be substantially the same. For example, an Atomic Layer Etching (ALE) may be used to realize a good etch control. In the example, the isolation portion defining layer 1003 may also contain SiGe and therefore may also be recessed by substantially the same depth. Accordingly, the etched sidewalls of the gate defining layers $1007_1$, $1007_2$, $1007_3$, 1013 (and the isolation portion defining layer 1003) may be substantially coplanar.

Figure 6:
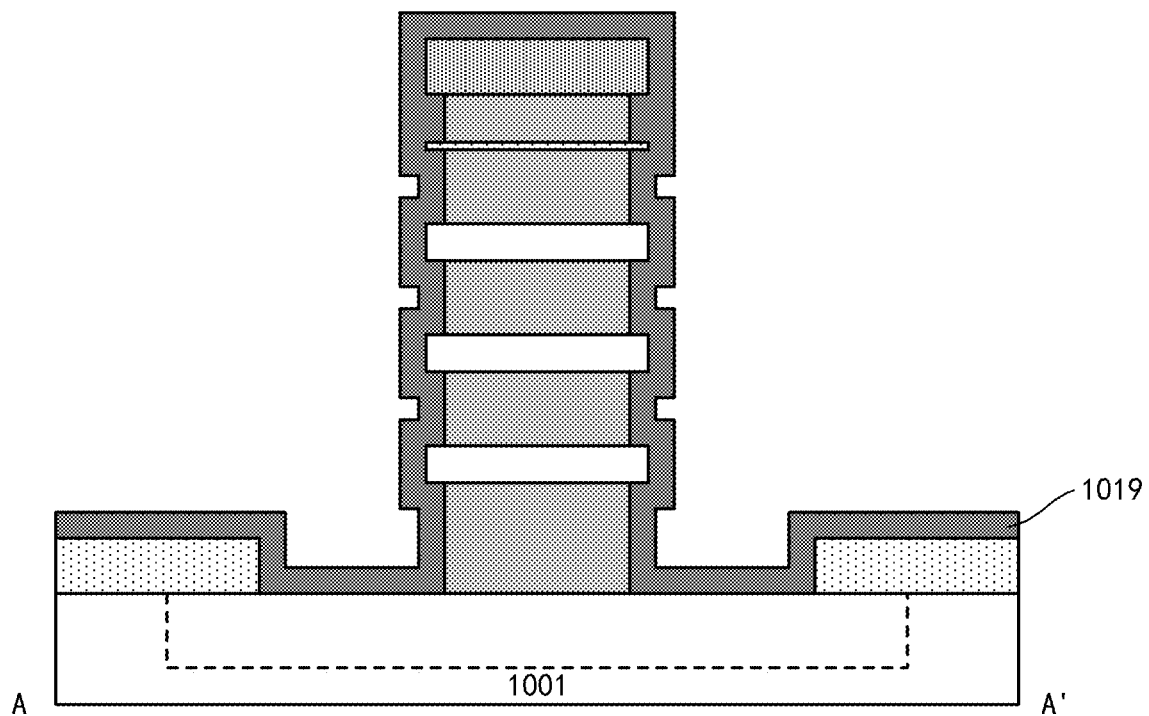

A spacer may be formed in the recess thus formed. As shown in FIG. 6, a dielectric material layer 1019 of a certain thickness may be formed on the substrate 1001 by, for example, deposition. A thickness of the deposited dielectric material layer 1019 may be, for example, about 3 nm to 15 nm, which is sufficient to fulfill the above-mentioned recess. For example, the dielectric material layer 1019 may contain SiC or the like.

Figure 7A:
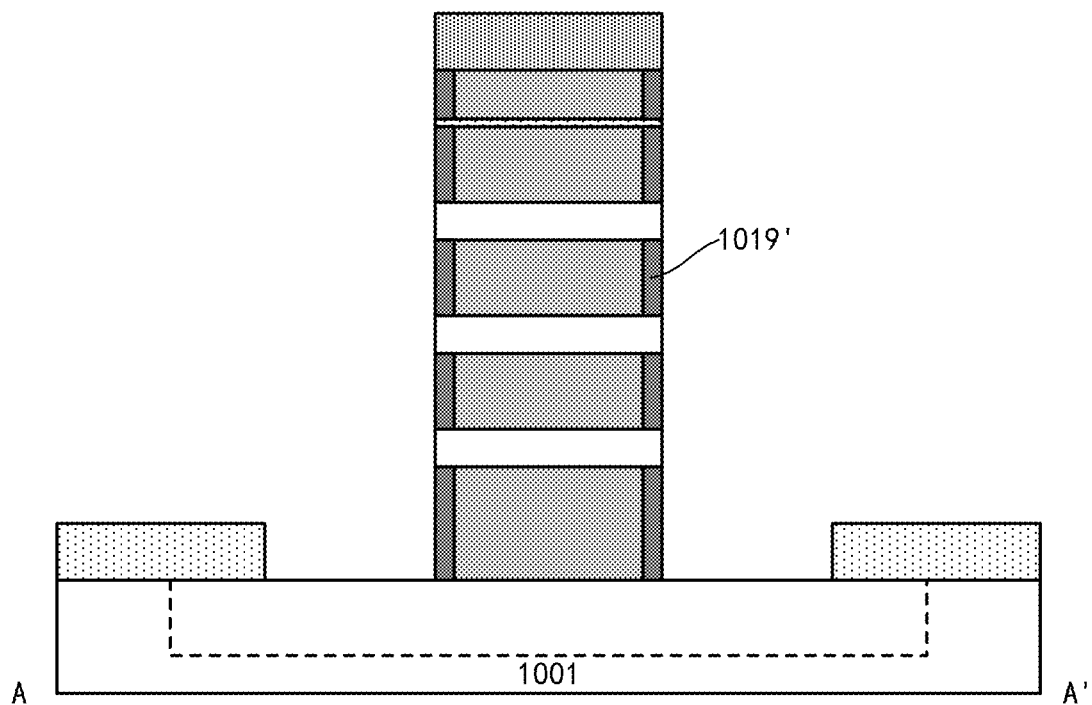
Figure 7B:
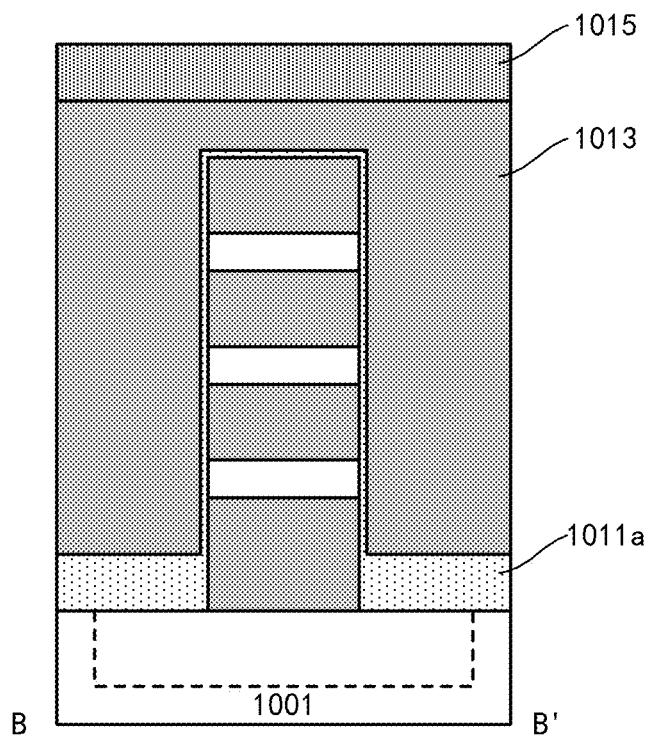

After that, as shown in FIG. 7(a) and FIG. 7(b), the dielectric material layer 1019 may be selectively etched by, for example, RIE in the vertical direction, so that the dielectric material layer 1019 may be left in the above-mentioned recess to form a spacer 1019'. A sidewall of the spacer 1019' may be substantially coplanar with the sidewall of the hard mask layer 1015 (and the sidewalls of the nanowire/nanosheet defining layers $1009_1$, $1009_2$).

Figure 8:
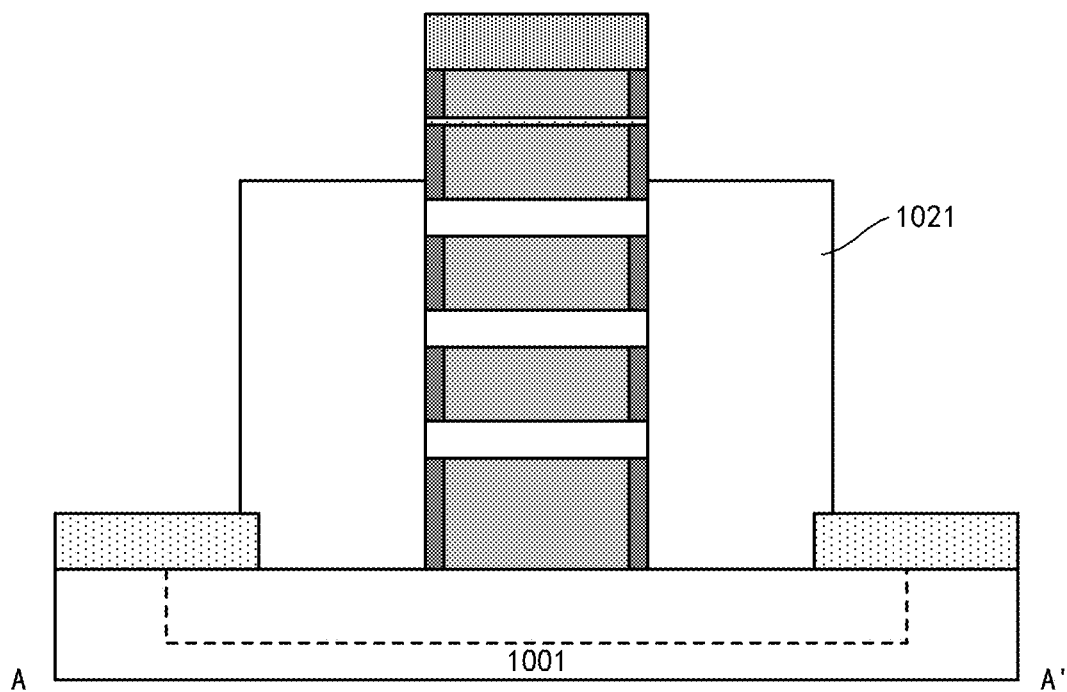

As shown in FIG. 7(a) and FIG. 7(b), the sidewalls of each nanowire/nanosheet defining layer $1009_1$, $1009_2$ is exposed to an outside (and may be substantially coplanar with the sidewall of the hard mask layer) in a direction (e.g., a horizontal direction on the paper surface in FIG. 7(a)) intersecting (e.g., perpendicular to) the extension direction of the dummy gate (the direction perpendicular to the paper surface in FIG. 7(a)). As shown in FIG. 8, the exposed sidewalls of the nanowire/nanosheet defining layers $1009_1$, $1009_2$ (and the exposed surface of the substrate 1001) may be used as a seed to form a source/drain layer 1021 by, for example, selective epitaxial growth. The source/drain layer 1021 may be connected to the exposed sidewalls of all the nanowire/nanosheet defining layers $1009_1$, $1009_2$. The source/drain layer 1021 may contain various suitable semiconductor materials. In order to enhance a device performance, the source/drain layer 1021 may contain a semiconductor material having a lattice constant different from that of the nanowire/nanosheet defining layers $1009_1$, $1009_2$, so as to apply a stress to the nanowire/nanosheet defining layers $1009_1$, $1009_2$ in which a channel region is to be formed. For example, for an n-type device, the source/drain layer 1021 may contain Si:C (an atomic percentage of C may be, for example, about 0.1% to 3%) to apply a tensile stress; for a p-type device, the source/drain layer 1021 may contain SiGe (an atomic percentage of Ge may be, for example, about 20% to 80%) to apply a compressive stress. In addition, the source/drain layer 1021 may be doped to a desired conductivity type (n-type doping for the n-type device and p-type doping for the p-type device) by, for example, in-situ doping or ion implantation.

In the embodiment shown in FIG. 8, the source/drain layer grown from the sidewalls of the nanowire/nanosheet defining layers $1009_1$, $1009_2$ is connected to a source/drain layer grown from the surface of the substrate 1001, which may facilitate heat dissipation or enhancing a stress in the channel so as to improve the device performance. Alternatively, the source/drain layer grown from the sidewalls of the nanowire/nanosheet defining layers $1009_1$, $1009_2$ and the source/drain layer grown from the surface of the substrate 1001 may be spaced apart from each other.

Next, a replacement gate process may be performed.

Figure 9A:
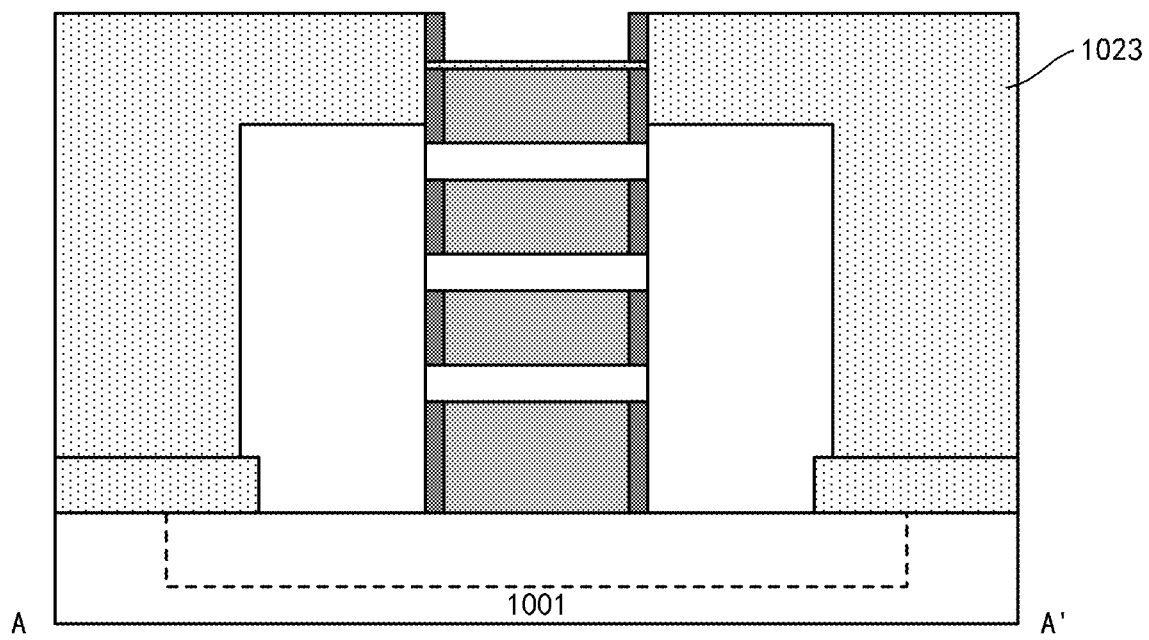
Figure 9B:
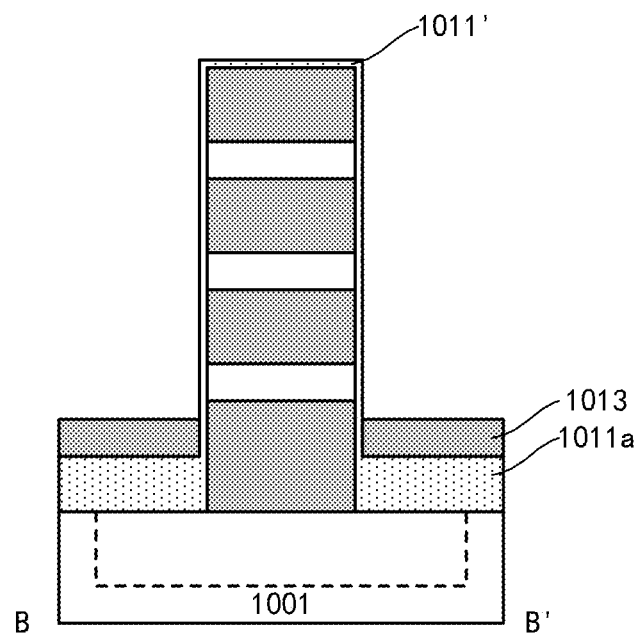

For example, as shown in FIG. 9(a) and FIG. 9(b), an interlayer dielectric layer 1023 may be formed on the substrate 1001. For example, the interlayer dielectric layer 1023 may be formed by depositing an oxide, performing a planarization process such as CMP on the deposited oxide, and etching back the planarized oxide. The interlayer dielectric layer 1023 may expose the hard mask layer 1015 while covering the source/drain layer 1021. After that, the hard mask layer 1015 may be removed by selective etching so as to expose the gate defining layer 1013.

In order to perform the replacement gate process, the dummy gate, i.e., all the gate defining layers $1007_1$, $1007_2$, $1007_3$ and 1013 need to be removed and replaced with a gate stack. Here, in consideration of a formation of an isolation portion below the lowermost gate defining layer $1007_1$, the isolation portion defining layer 1003 may be processed firstly. Specifically, the isolation portion defining layer 1003 is replaced with an isolation portion. To this end, a processing channel to the isolation portion defining layer 1003 may be formed.

Figure 10A:
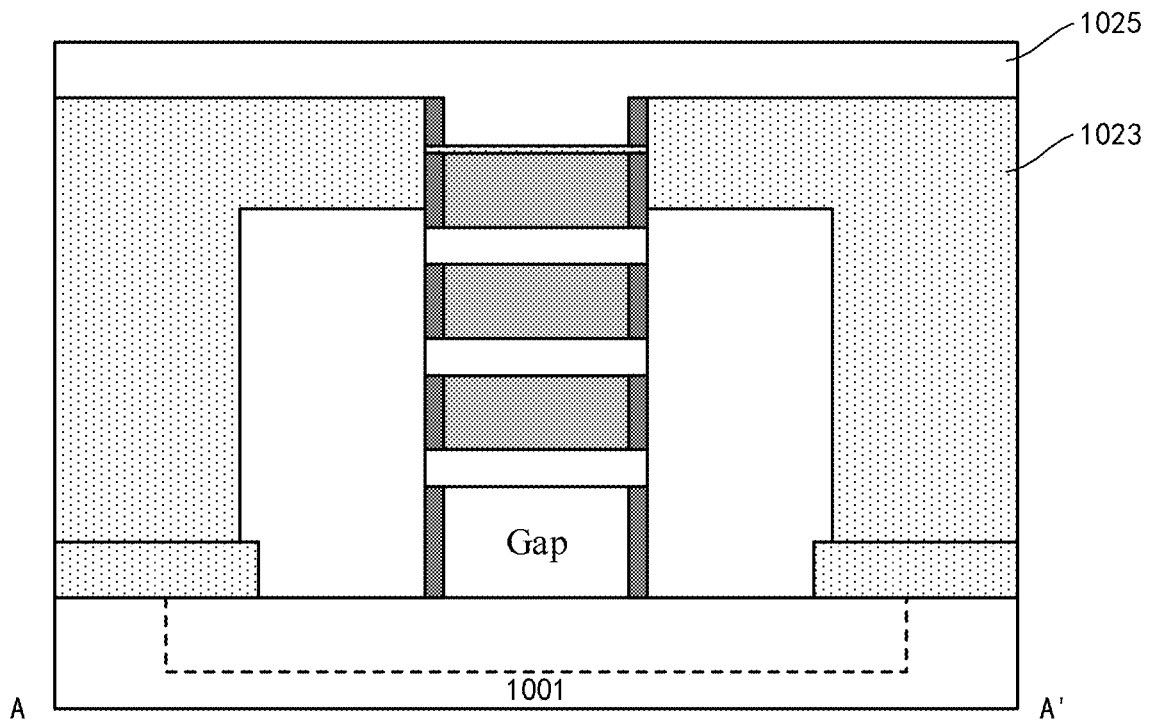
Figure 10B:
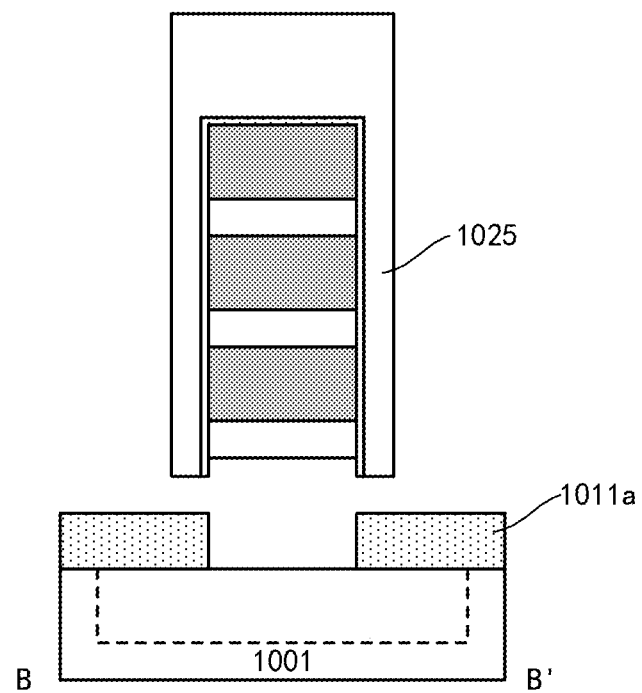

For example, a selective etching may be performed to reduce a height of a top surface of the gate defining layer 1013 to be lower than a top surface of the isolation portion defining layer 1003, but a certain thickness of the gate defining layer 1013 still remains so that a mask layer subsequently formed (1025 in FIG. 10(a) and FIG. 10(b)) may shield all the gate defining layers $1007_1$, $1007_2$, $1007_3$ above the top surface of the isolation portion defining layer

1003 while exposing the isolation portion defining layer 1003. For example, ALE may be used to better control an etching depth. Here, other gate defining layers 1007₁, 1007₂, 1007₃ may not be affected due to an existence of the etch stop layer 1011'.

Then, as shown in FIG. 10(*a*) and FIG. 10(*b*), a mask layer such as a photoresist 1025 may be formed on the gate defining layer 1013. The photoresist 1025 may be patterned by photolithography into a strip shape extending in the extension direction of the nanowire/nanosheet defining layers 1009₁, 1009₂, the photoresist may shield an outer surface of the nanowire/nanosheet defining layers 1009₁, 1009₂ and the gate defining layers 1007₁, 1007₂, 1007₃ (with the etch stop layer 1011' interposed therebetween). Due to an existence of the gate defining layer 1013, a portion of a surface of the isolation portion defining layer 1003 is not shielded by the photoresist 1025. After that, a selective etching may be performed to sequentially remove the gate defining layer 1013, a portion of the etch stop layer 1011' exposed by a removal of the gate defining layer 1013, and the isolation portion defining layer 1003 exposed by a removal of the portion of the etch stop layer 1011'. A gap is then formed below the etch stop layer 1005. Since the isolation portion defining layer 1003, the nanowire/nanosheet defining layers and the gate defining layer located above are defined by the same hard mask layer, the isolation portion defining layer 1003 may be aligned with the nanowire/nanosheet defining layers and the gate defining layer located above in the vertical direction. Accordingly, the gap formed by the removal of the isolation portion defining layer 1003 may be self-aligned with the nanowire/nanosheet defining layers and the gate defining layer located above. After that, the photoresist 1025 may be removed.

Figure 11A:
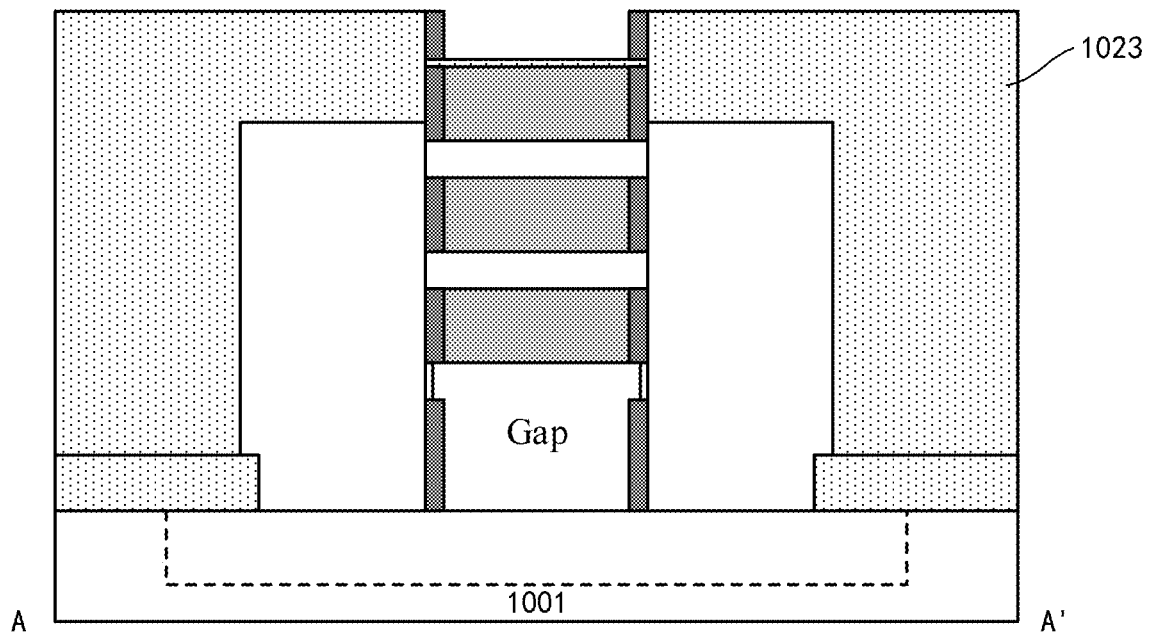
Figure 11B:
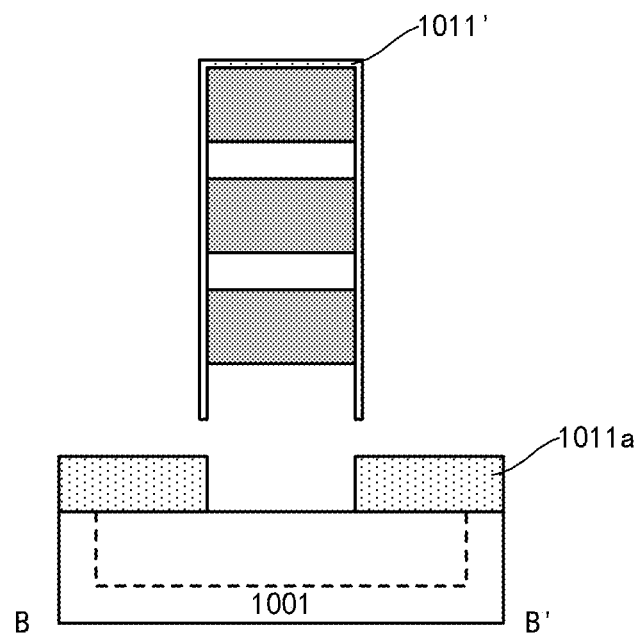

In the example, the etch stop layer 1005 also contains a semiconductor material and is connected between opposite source/drain layers, which may result in a leakage path. To this end, as shown in FIG. 11(*a*) and FIG. 11(*b*), the etch stop layer 1005 may be cut off between the opposite source/drain layers by selective etching, for example, wet etching using a TMAH solution. Ends of the etch stop layer 1005 may be remained so as not to affect the source/drain layers on the two sides. On the other hand, the remained ends of the etch stop layer 1005 may not extend to an inner side of the spacer so as not to contact the gate defining layer (which is then replaced with a gate stack) on the inner side of the spacer. That is, an inner sidewall of the remained etch stop layer 1005 may be recessed with respect to an inner sidewall of the spacer. Since the etching is started from a middle, opposite ends of the remained etch stop layer 1005 may be substantially symmetrical. In addition, in the example, both the etch stop layer 1005 and the substrate 1001 contain silicon, thus a portion of the substrate 1001 may also be etched (not shown). Therefore, the gap between the lowermost gate defining layer 1007₁ and the substrate 1001 may be enlarged, but may still be kept substantially aligned with the nanowire/nanosheet defining layers and the gate defining layer located above.

Figure 12A:
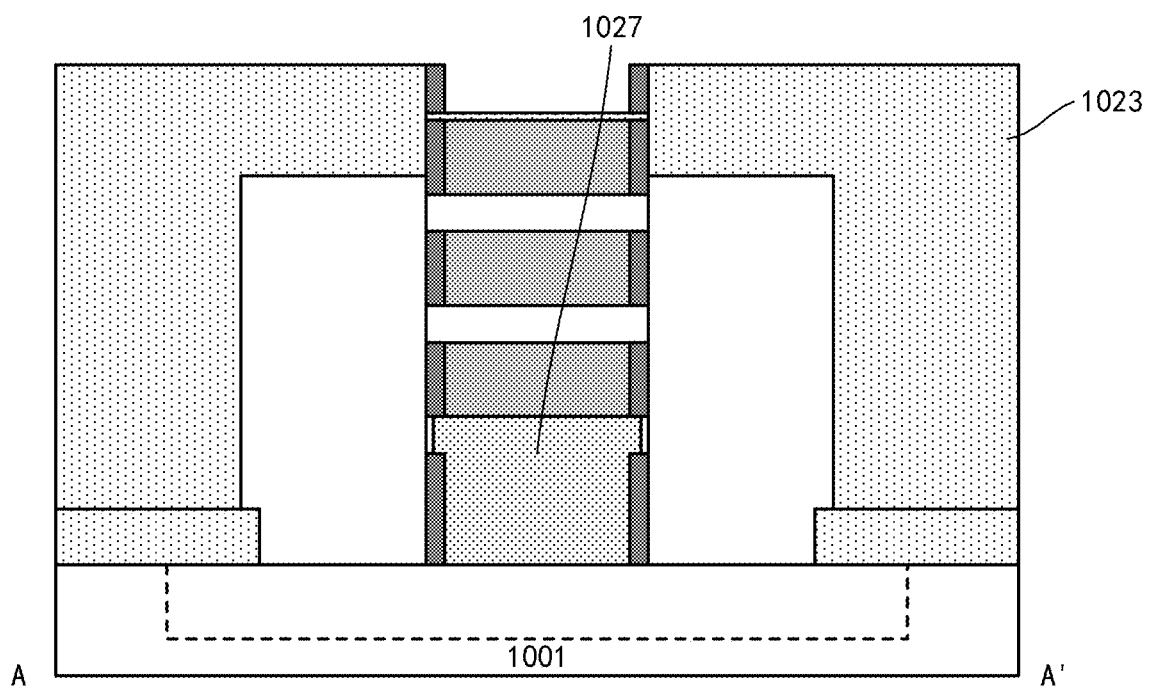
Figure 12B:
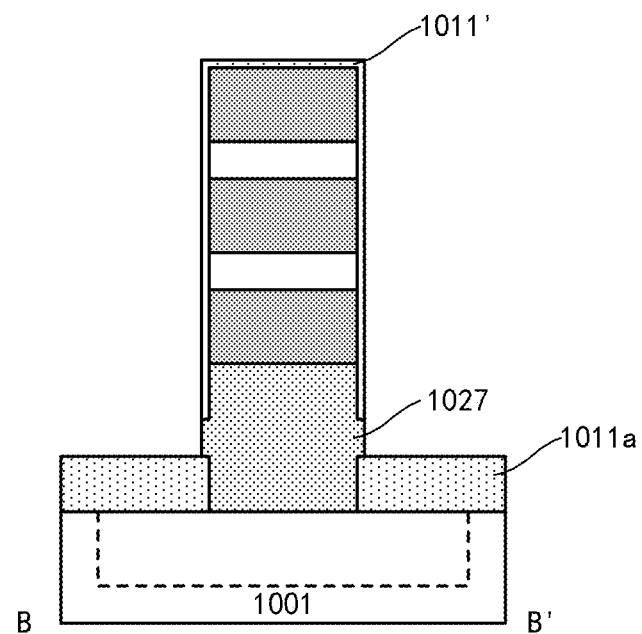

As shown in FIG. 12(*a*) and FIG. 12(*b*), the gap thus formed may be filled with a dielectric material, such as a low-k dielectric material, to form an isolation portion 1027. A material of the isolation portion 1027, for example, an oxynitride (e.g., silicon oxynitride), may have etching selectivity relative to the STI 1011*a* and the interlayer dielectric layer 1023. For example, the isolation portion 1027 may be formed by depositing a sufficient oxynitride on the substrate 1001 and etching back the deposited oxynitride by, for example, RIE. The isolation portion 1027 thus formed may be self-aligned with the nanowire/nanosheet defining layers and the gate defining layer located above.

Figure 13A:
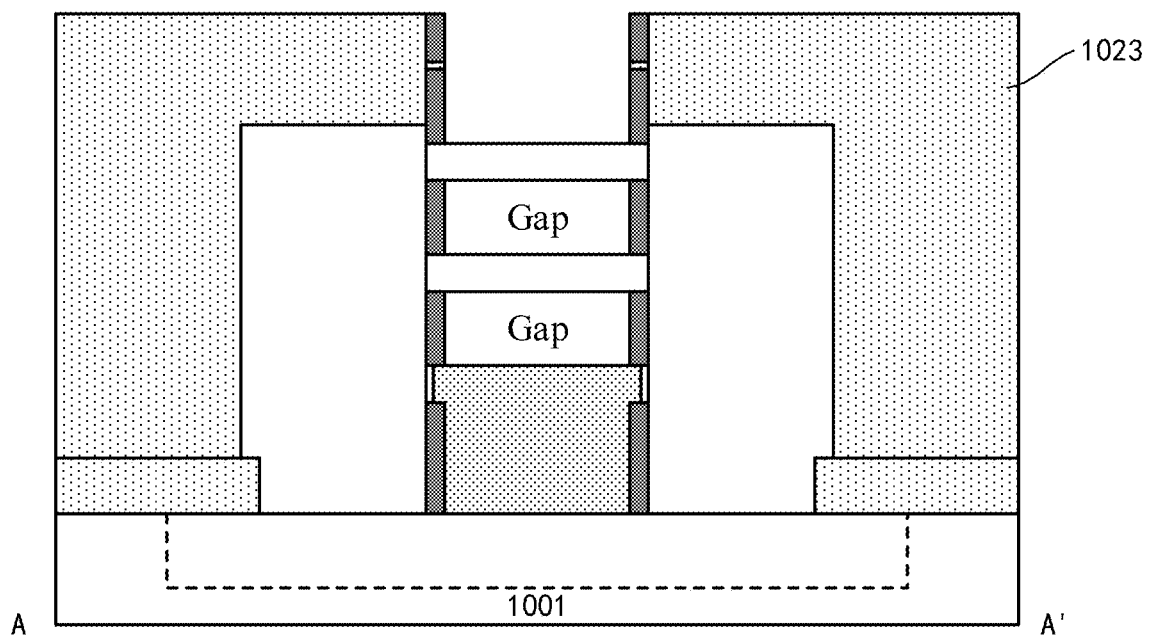
Figure 13B:
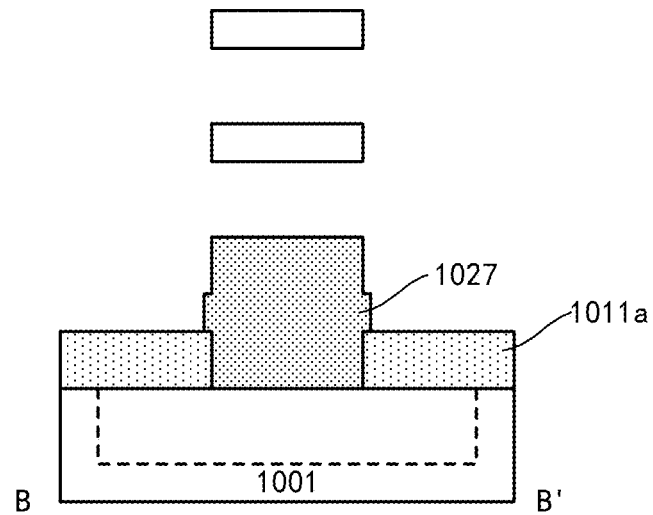

Next, as shown in FIG. 13(*a*) and FIG. 13(*b*), the thin etch stop layer 1011' may be removed by selective etching to expose the gate defining layers 1007₁, 1007₂, 1007₃, and the gate defining layers 1007₁, 1007₂, 1007₃ may be further removed by selective etching. Thus, a gate trench (corresponding to space originally occupied by the gate defining layers 1007₁, 1007₂, 1007₃ and 1013) may be formed above the STI 1011*a* and the isolation portion 1027 on the inner side of the spacer 1019'.

The nanowire/nanosheet defining layers 1009₁, 1009₂ may be exposed in the gate trench. More than one nanowire/nanosheet may be defined in each nanowire/nanosheet defining layer 1009₁, 1009₂ so as to realize a higher density of the nanowires/nanosheets.

For example, as shown in FIG. 14(*a*), a photoresist 1029 may be formed and may be patterned by photolithography into a pattern that shields portions N1, N2 (which may be finally presented in a nanowire/nanosheet form and therefore may also be referred to as nanowires/nanosheets N1, N2) of the nanowire/nanosheet defining layers 1009₁, 1009₂ to be used as a device channel region and a connection portion S between the nanowires/nanosheets N1 and N2. The nanowires/nanosheets N1, N2 may be connected between the source/drain layers 1021 on two opposite sides (left and right sides in the horizontal direction on the paper surface in FIG. 14(*a*)), and a conductive path (or referred to as a channel) between the source/drain regions formed in the source/drain layer 1021 may be formed in the nanowires/nanosheets N1, N2. A connection portion S is connected between the nanowires/nanosheets N1 and N2, and may support the nanowires/nanosheets N1, N2 so as to, for example, prevent the nanowires/nanosheets N1 and N2 from adhering to each other during a manufacturing process. Therefore, the connection portion S may also be referred to as a support portion. Here, the support portion S is connected between an approximately middle portion of each of the nanowires/sheets N1, N2.

That is, two (or more) nanowires/nanosheets may be defined in a single nanowire/nanosheet defining layer. The nanowires/nanosheets N1, N2 may be closer compared with a case that two (or more) nanowire/nanosheet defining layers corresponding to the nanowires/nanosheets N1, N2 are directly formed, so that a higher density may be realized.

For example, minimum spacing between the nanowires/nanosheets N1, N2 (as shown by an arrowed line segment in the vertical direction in FIG. 14(*a*)) may be about 5 nm to 30 nm, and a width of the support portion S (a dimension in the horizontal direction on the paper surface in FIG. 14(*a*)) may be about 5 nm to 15 nm.

A layout of the nanowires/nanosheets and the support portion therebetween is not limited to the example shown in FIG. 14(*a*).

For example, as shown in FIG. 14(*b*), a photoresist 1029' may be formed and may be patterned into a pattern that shields the nanowires/nanosheets N1, N2 and support portions S1, S2 between the nanowires/nanosheets N1 and N2. Here, the support portions S1, S2 may be provided between respective ends of the nanowires/nanosheets N1, N2, respectively. Similarly, minimum spacing between the nanowires/nanosheets N1, N2 (as shown by an arrowed line segment in the vertical direction in FIG. 14(*b*)) may be about 5 nm to 30 nm.

Figure 14A:
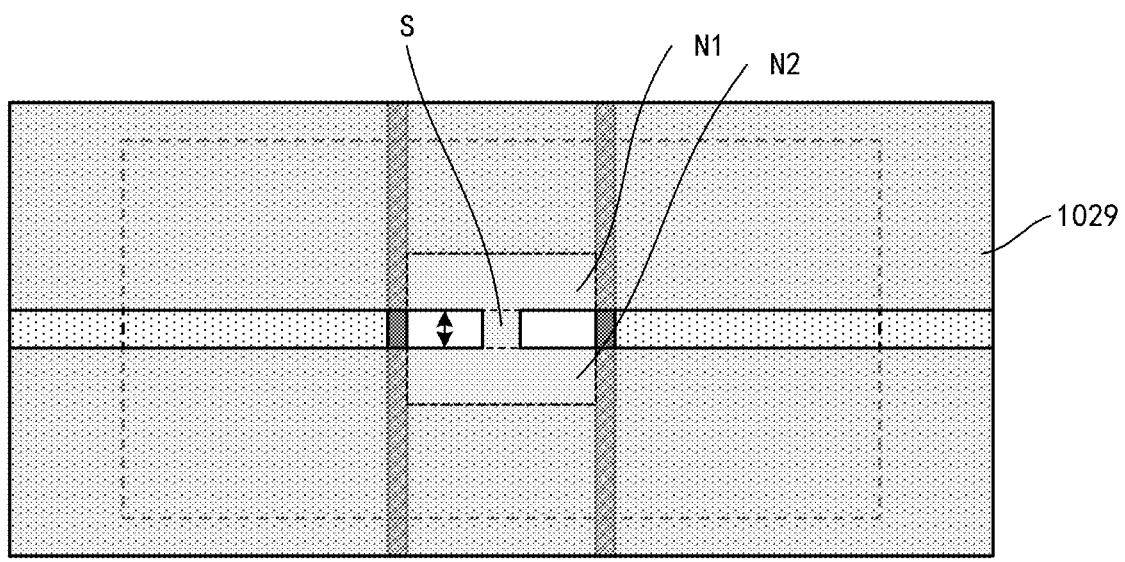
Figure 14B:
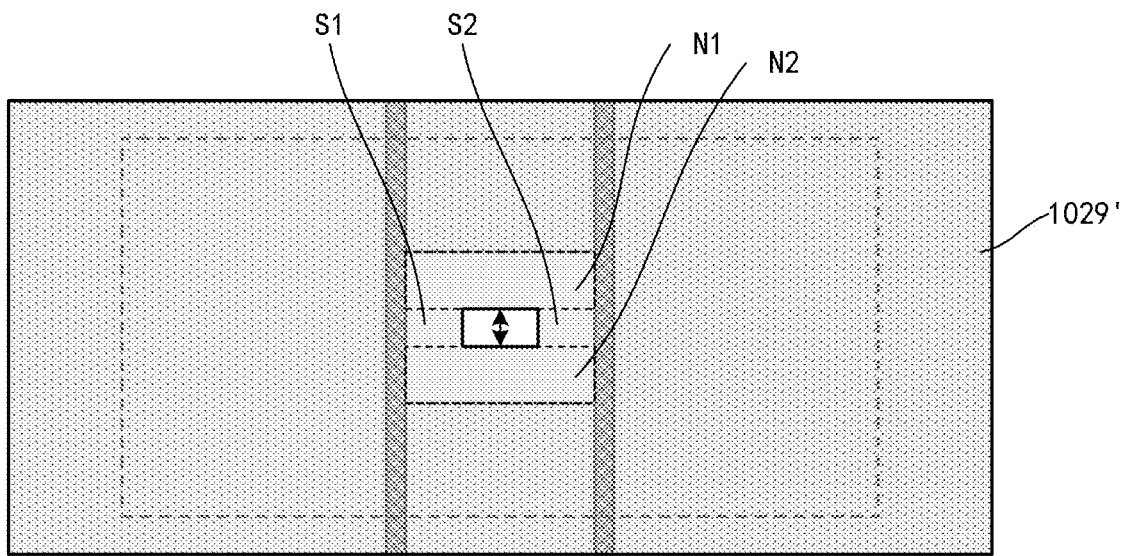
Figure 14C:
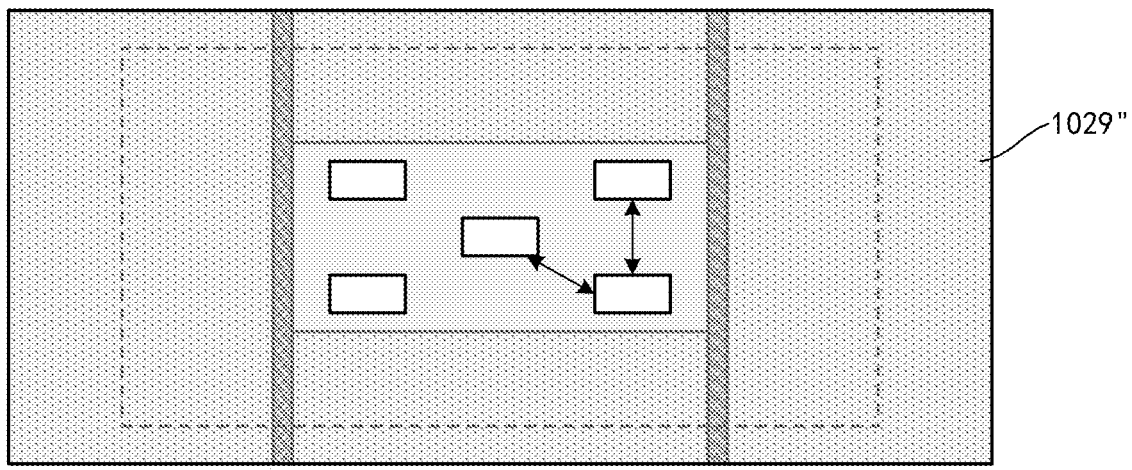

For another example, as shown in FIG. 14(*c*), a photoresist 1029" may be formed and may be patterned into a pattern that shields the nanowire/nanosheet defining layers $1009_1$, $1009_2$ and that is formed with openings to expose a portion or some portions of the nanowire/nanosheet defining layers $1009_1$, $1009_2$. The device performance, such as a conduction current, a power consumption, etc., may be optimized by adjusting a size and/or spacing of the openings. For example, as shown by an arrowed line segment in FIG. 14(c), spacing between the openings may be about 5 nm to 20 nm.

It should be noted that, a size of the nanowire/nanosheet defining layers $1009_1$, $1009_2$ in the example shown in FIG. 14(c) is different from that in FIG. 14(a) and FIG. 14(b).

In addition, openings subsequently defined in the nanowire/nanosheet defining layers $1009_1$, $1009_2$ through the openings in the photoresist may provide a selection of additional channel planes and crystal planes so as to enhance the device performance such as the conduction current and the like. In the examples shown in FIG. 14(a) to FIG. 14(c), the openings in the photoresists 1029, 1029', 1029" have sides in the extension direction (the vertical direction on the paper surface in FIG. 14(a) to FIG. 14(c) of the (dummy) gate and sides in the direction perpendicular to the extension direction (a horizontal direction on the paper surface in FIG. 14(a) to FIG. 14(c)) of the (dummy) gate. For example, a shape of the openings may be changed so that at least some of the sides are angled with respect to the directions so as to provide different orientations.

Hereinafter, a case in FIG. 14(a) is illustrated by way of example for convenience.

As shown in FIG. 15(a) to FIG. 15(d), with the photoresist 1029 as a mask, the nanowire/nanosheet defining layers $1009_1$, $1009_2$ may be patterned into a pattern corresponding to the photoresist 1029 by selective etching such as RIE (which may stop at the isolation portion 1027). Each of the nanowire/nanosheet defining layers 10091, 10092 may include the nanowires/nanosheets N1, N2 extending between the source/drain layers on the two opposite sides and the support portion S between the nanowires/nanosheets N1, N2. After that, the photoresist 1029 may be removed.

Specifically, in the case of the photoresist 1029 of FIG. 14(a), each of the patterned nanowire/nanosheet defining layers $1009_1$, $1009_2$ may have a shape of character ".T." when viewed from above (ie, each of the nanowire/nanosheet defining layers $1009_1$, $1009_2$ has an opening at a center of each of the two opposite sides of each of the nanowire/nanosheet defining layers $1009_1$, $1009_2$).

In addition, in the case of the photoresist 1029' of FIG. 14(b), each of the patterned nanowire/nanosheet defining layers $1009_1$, $1009_2$ may have a shape of character "□" when viewed from above (ie, each of the nanowire/nanosheet defining layers $1009_1$, $1009_2$ has an opening at a center of each of the nanowire/nanosheet defining layers $1009_1$, $1009_2$).

In addition, in the case of the photoresist 1029" of FIG. 14(c), each of the patterned nanowire/nanosheet defining layers $1009_1$, $1009_2$ may have a sheet shape with a plurality of openings when viewed from above.

Figure 15A:
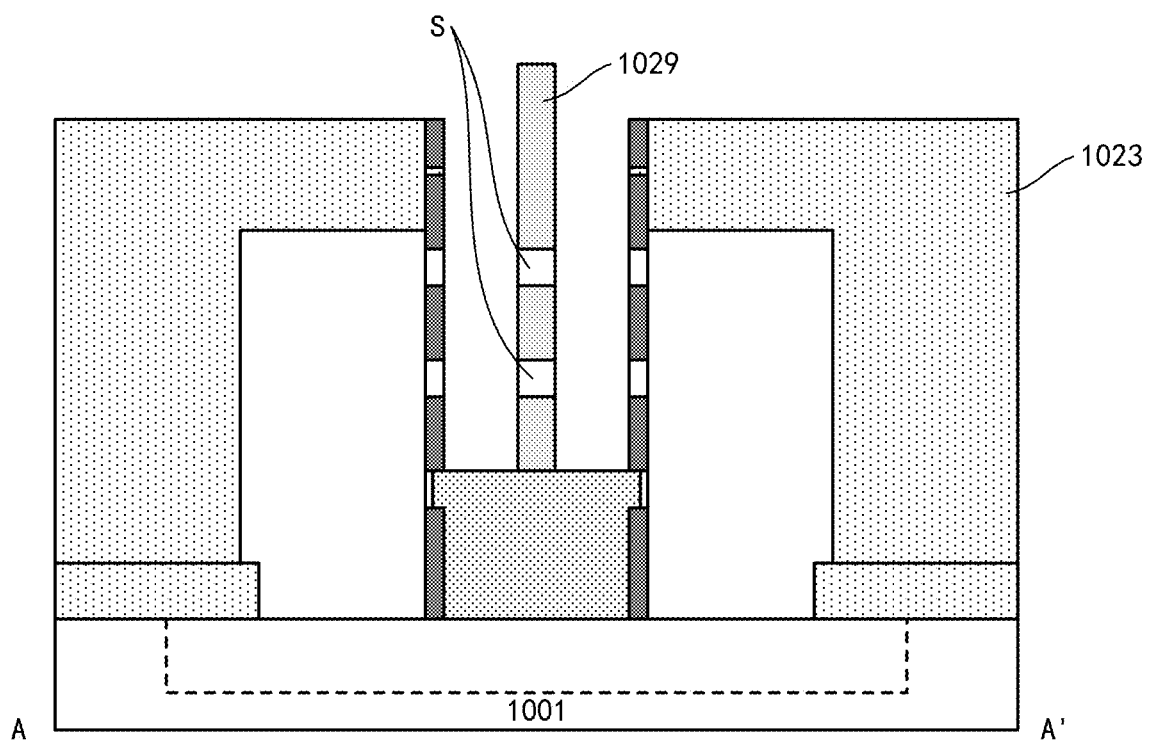
Figure 15B:
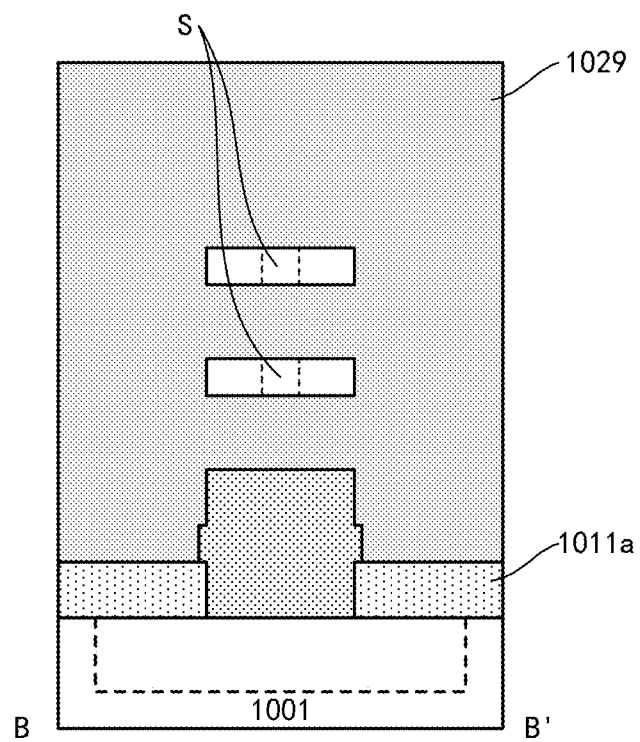
Figure 15C:
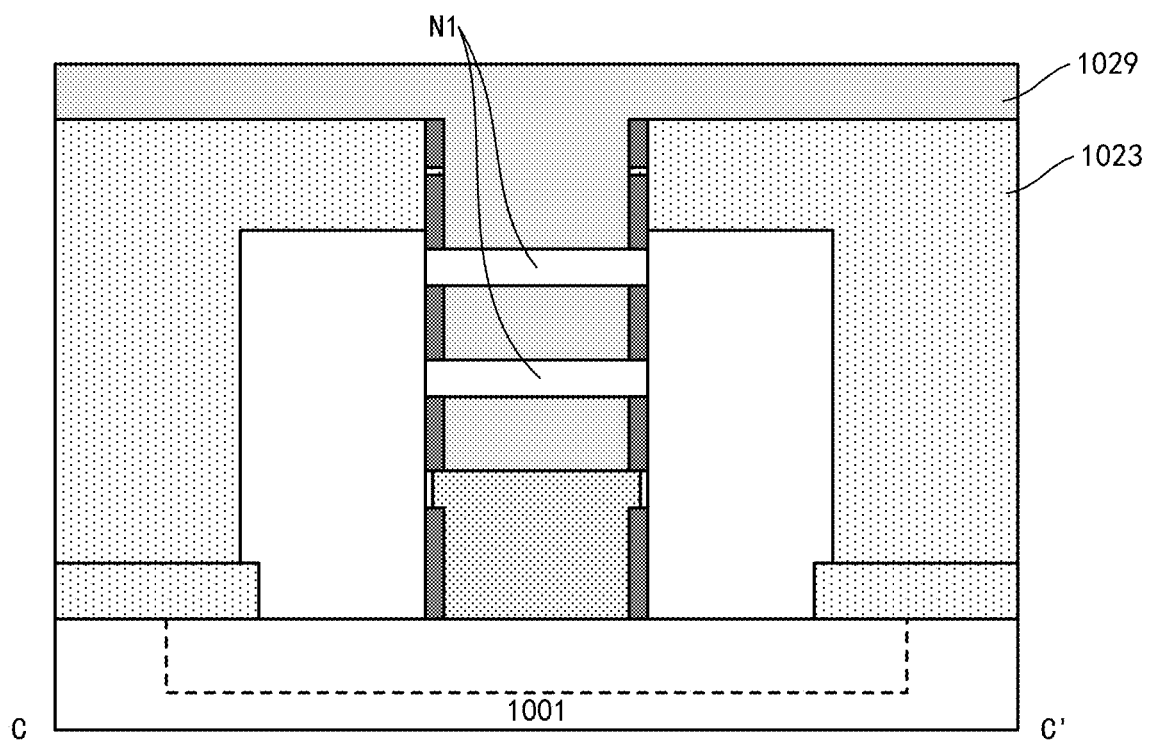
FIG. 15(c) and FIG. 16(c) are cross-sectional views taken along the line CC'.
Figure 15D:
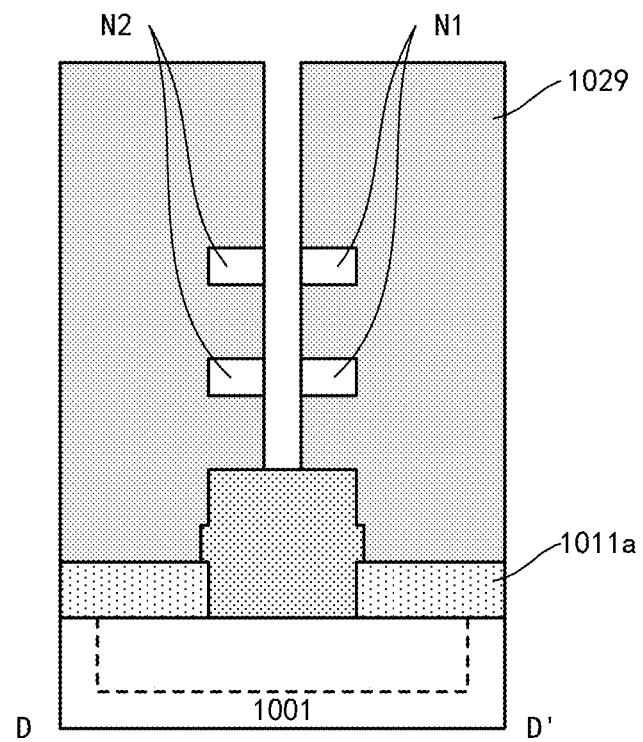

In the example, as shown in FIG. 15(c) and FIG. 15(d), a dimension of a cross-section of the nanowires/nanosheets N1, N2 is much smaller than an extension length of the nanowires/nanosheets N1, N2, so the nanowires/nanosheets N1, N2 may be presented in the nanowire form. However, the present disclosure is not limited to this. For example, at least one dimension in the cross-section of the nanowires/nanosheets N1, N2 may be equal to or close to the extension length, so that the nanowires/nanosheets N1, N2 may be presented in the nanosheet form.

As shown in FIG. 16(a) to FIG. 16(d), a gate dielectric layer 1033 and a gate electrode 1035 may be sequentially formed in the gate trench so as to obtain a final gate stack. For example, the gate dielectric layer 1033 may contain a high-k gate dielectric such as $HfO_2$ with a thickness of about 2 nm to 10 nm; the gate electrode 1035 may include a work function adjustment layer such as TiN, TiAlN, TaN, etc. and a gate conductor layer such as W, Co, Ru, etc. An interface layer, for example, an oxide formed by an oxidation process or deposition such as Atomic Layer Deposition (ALD) with a thickness of about 0.3 nm to 2 nm, may be further formed before the high-k gate dielectric is formed.

The nanowire/nanosheet device according to the embodiment may include one or more layers of nanowires/nanosheets spaced apart from the substrate 1001, and each layer of the nanowire/nanosheets may include two or more nanowires/nanosheets N1, N2. The nanowires/nanosheets N1 and N2 in each layer may be connected by a support portion S, and the nanowires/nanosheets N1, N2 and the support portion S in each layer may be substantially coplanar and integral. A gate stack, including the gate dielectric layer 1033 and the gate electrode 1035, may surround the nanowires/nanosheets N1, N2 (and may surround an entirety of the nanowires/nanosheets N1, N2 and the support portion S).

The spacers 1019' may be formed on a sidewall of the gate stack. The inner sidewalls of the spacers 1019' may be substantially coplanar in the vertical direction so as to provide substantially the same gate length. In addition, Outer sidewalls of the spacer 1019' may also be coplanar in the vertical direction, and may be coplanar with corresponding sidewalls of the nanowires/nanosheets N1, N2.

Figure 16A:
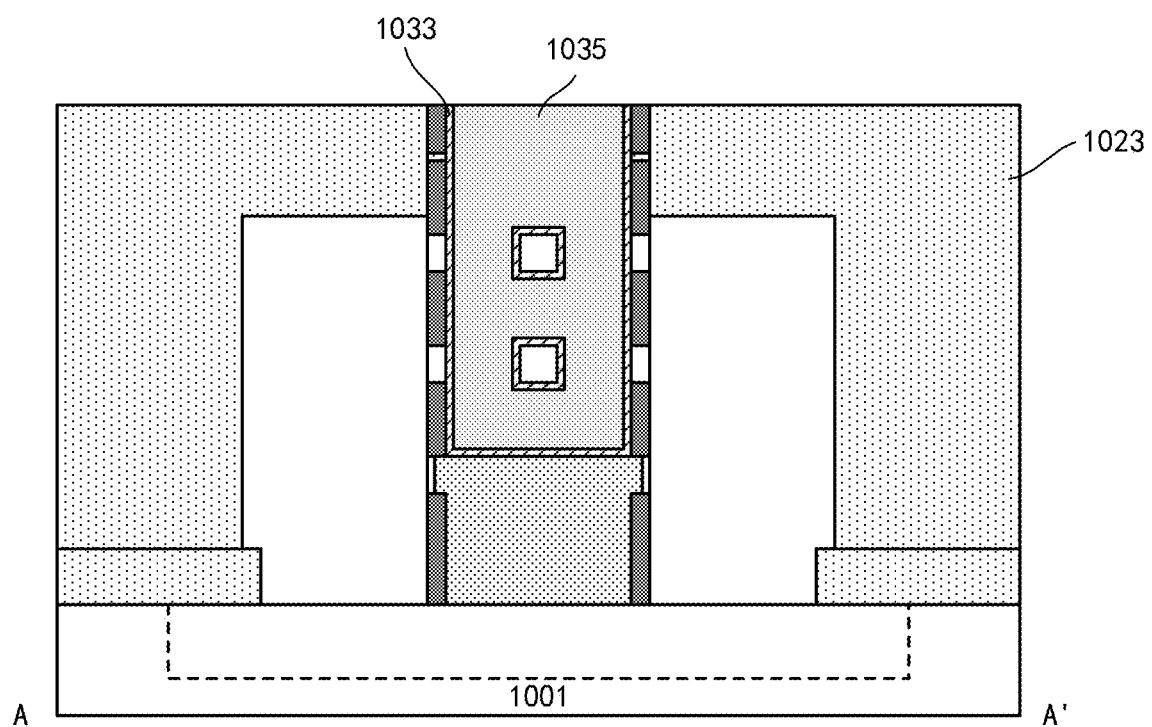
Figure 16B:
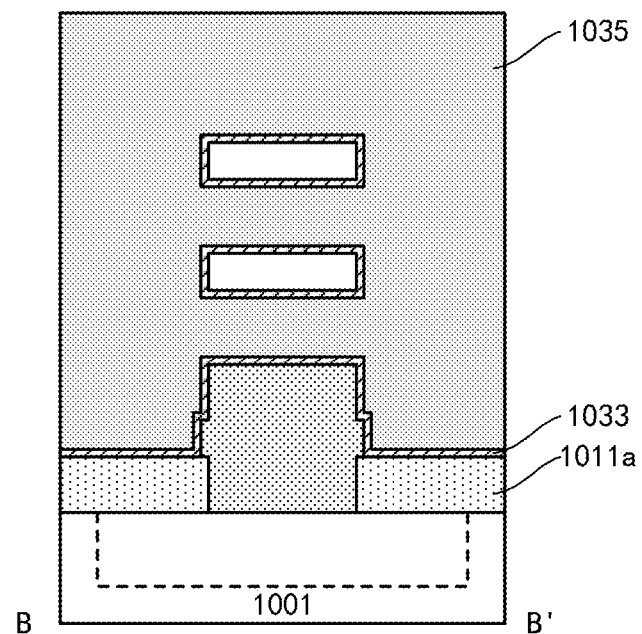
Figure 16C:
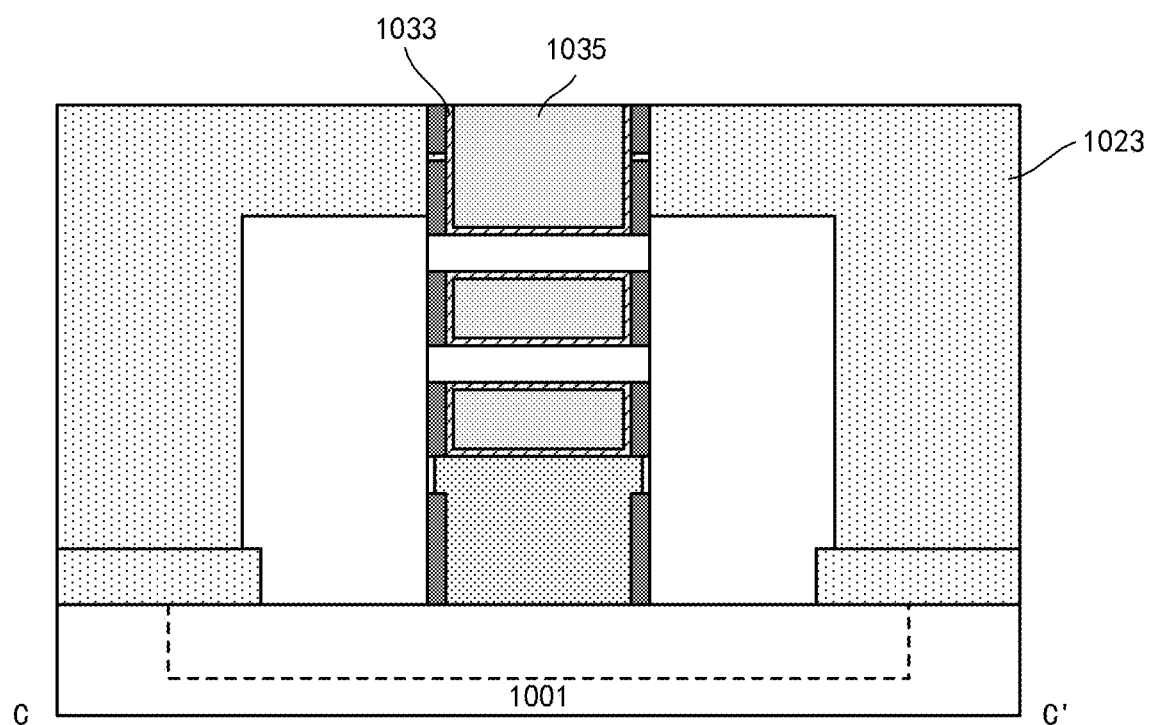
Figure 16D:
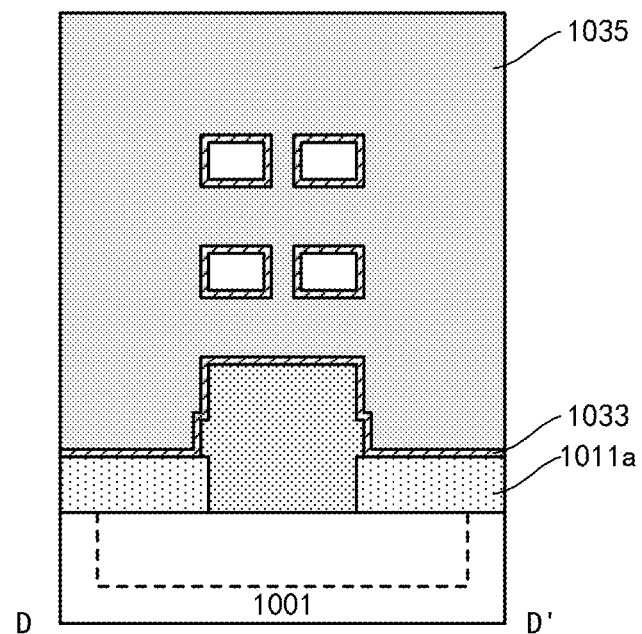

The nanowire/nanosheet device may further include an isolation portion 1027. As described above, the isolation portion 1027 may be self-aligned with the gate stack or the nanosheets N1, N2, and then at least a portion of the sidewall of the isolation portion 1027 may be aligned with the corresponding sidewall of the gate stack located above in the vertical direction. For example, as shown in FIG. 16(a) and FIG. 16(c), at least a middle portion of each of the opposite sidewalls of the isolation portion 1027 in the extension direction (the horizontal direction on the paper surface in the drawing) of the nanowire/nanosheet may be aligned with the sidewall of the corresponding gate stack in the vertical direction. In addition, as shown in FIG. 15(b) and FIG. 15(d), at least an upper portion of each of the opposite sidewalls of the isolation portion 1027 in the extension direction (the horizontal direction on the paper surface in the drawing) of the gate may be aligned with the sidewall of the corresponding gate stack (at an interface between the gate stack and the nanowire/nanosheet) in the vertical direction. A portion of each of the sidewall of the isolation portion 1027 not coplanar with the corresponding sidewall of the gate stack (if existing; the portions are formed by the process and may not exist depending on the process) may extend substantially conformally with the corresponding sidewall of the gate stack.

The spacer 1019' may be further formed on the sidewall of the isolation portion 1027. An upper portion of the isolation portion 1027 may be interposed between upper and lower portions of the spacer 1019', but does not extend beyond the outer sidewall of the spacer 1019'.

As described above, the isolation portion 1027 is aligned with the nanowires/nanosheets N1, N2 in the vertical direction. In addition, as shown in FIG. 15(b) and FIG. 15(d), the isolation portion 1027 is connected to the STI 1011a on two opposite sides in the extension direction (the horizontal direction on the paper surface in the drawing) of the gate, so that the gate stack is isolated from the substrate by both the isolation portion 1027 and the STI 1011*a*.

The nanowire/nanosheet device according to the embodiments of the present disclosure may be applied to various electronic apparatuses. For example, an Integrated Circuit (IC) may be formed based on the nanowire/nanosheet device, and thus an electronic apparatus may be constructed. Accordingly, the present disclosure further provides an electronic apparatus including the nanowire/nanosheet device described above. The electronic apparatus may further include a display screen cooperating with the integrated circuit, a wireless transceiver cooperating with the integrated circuit, and other components. The electronic apparatus may include, for example, a smart phone, a Personal Computer (PC), a tablet computer, an artificial intelligence apparatus, a wearable apparatus or a portable power supply, etc.

According to the embodiments of the present disclosure, there is further provided a method of manufacturing a System on Chip (SoC). The method may include the method described above. In particular, various devices may be integrated on a chip, at least some of which are manufactured according to the method of the present disclosure.

In the above descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the embodiments are described above separately, this does not mean that the measures in the embodiments may not be advantageously used in combination.

The embodiments of the present disclosure have been described above. However, these embodiments are for illustrative purposes only, and are not used to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A nanowire/nanosheet device comprising:
a substrate;
a first source/drain layer and a second source/drain layer opposite to each other in a first direction on the substrate;
a first nanowire/nanosheet and a second nanowire/nanosheet, wherein the first nanowire/nanosheet and the second nanowire/nanosheet are spaced apart from a surface of the substrate, the first nanowire/nanosheet and the second nanowire/nanosheet extend from the first source/drain layer to the second source/drain layer, respectively, and are arranged adjacent to each other in a direction parallel to the surface of the substrate;
a first support portion connected between the first nanowire/nanosheet and the second nanowire/nanosheet; and
a gate stack extending in a second direction to surround the first nanowire/nanosheet and the second nanowire/nanosheet, wherein the second direction intersects the first direction,
a third nanowire/nanosheet and a fourth nanowire/nanosheet, wherein the third nanowire/nanosheet and the fourth nanowire/nanosheet are spaced apart from the surface of the substrate, the third nanowire/nanosheet and the fourth nanowire/nanosheet extend from the first source/drain layer to the second source/drain layer, respectively, and are arranged adjacent to each other in the direction parallel to the surface of the substrate; and
a second support portion connected between the third nanowire/nanosheet and the fourth nanowire/nanosheet,
wherein the third nanowire/nanosheet is substantially aligned with the first nanowire/nanosheet in a direction perpendicular to the surface of the substrate, the fourth nanowire/nanosheet is substantially aligned with the second nanowire/nanosheet in the direction perpendicular to the surface of the substrate, and the second support portion is substantially aligned with the first support portion in the vertical direction, and
wherein the gate stack further surrounds the third nanowire/nanosheet and the fourth nanowire/nanosheet.

2. The nanowire/nanosheet device according to claim 1, wherein the first nanowire/nanosheet is substantially coplanar with the second nanowire/nanosheet.

3. The nanowire/nanosheet device according to claim 1, wherein the first nanowire/nanosheet is substantially coplanar with the second nanowire/nanosheet and the first support portion.

4. The nanowire/nanosheet device according to claim 1, wherein the first nanowire/nanosheet is integral with the second nanowire/nanosheet and the first support portion.

5. The nanowire/nanosheet device according to claim 4, wherein when viewed from above, the first nanowire/nanosheet, the second nanowire/nanosheet and the first support portion as a whole has a sheet shape with an opening formed in the sheet shape.

6. The nanowire/nanosheet device according to claim 5, wherein when viewed from above, the first nanowire/nanosheet, the second nanowire/nanosheet and the first support portion as a whole has a shape of a character "⊥" or a shape of a character "⊓".

7. The nanowire/nanosheet device according to claim 5, wherein the sheet shape has a plurality of openings, and a minimum spacing among the plurality of openings is in a range of 5 nm to 20 nm.

8. The nanowire/nanosheet device according to claim 5, wherein a plurality of nanowire/nanosheet devices are provided on the substrate, and the openings of at least some of the plurality of nanowire/nanosheet devices are different in at least one of numbers, shapes, sizes and layouts.

9. The nanowire/nanosheet device according to claim 4, wherein the gate stack surrounds an entirety of the first nanowire/nanosheet, the second nanowire/nanosheet, and the first support portion.

10. The nanowire/nanosheet device according to claim 1, wherein a minimum spacing between the first nanowire/nanosheet and the second nanowire/nanosheet is in a range of 5 nm to 30 nm.

11. The nanowire/nanosheet device according to claim 1, wherein the first support portion has a width in a range of 5 nm to 15 nm.

12. An electronic apparatus comprising the nanowire/nanosheet device according to claim 1.

13. The electronic apparatus according to claim 12, wherein the electronic apparatus comprises a smart phone, a personal computer, a tablet computer, an artificial intelligence apparatus, a wearable device, or a portable power supply.

14. A method of manufacturing a nanowire/nanosheet device, comprising:
- forming a nanowire/nanosheet defining layer on a substrate, wherein the nanowire/nanosheet defining layer is spaced apart from the substrate;
- forming a first source/drain layer and a second source/drain layer on two opposite sides of the nanowire/nanosheet defining layer in a first direction, wherein the first source/drain layer and the second source/drain layer are connected to the nanowire/nanosheet defining layer;
- patterning the nanowire/nanosheet defining layer into a pattern comprising: a first nanowire/nanosheet and a second nanowire/nanosheet extending from the first source/drain layer to the second source/drain layer, respectively, and a first support portion connected between the first nanowire/nanosheet and the second nanowire/nanosheet;
- forming a gate stack on the substrate, wherein the gate stack extends in a second direction intersecting the first direction and surrounds the first nanowire/nanosheet and the second nanowire/nanosheet,
- wherein the forming a nanowire/nanosheet defining layer on a substrate, wherein the nanowire/nanosheet defining layer is spaced apart from the substrate comprises:
- forming the nanowire/nanosheet defining layer on the substrate, wherein the nanowire/nanosheet defining layer is spaced apart from the substrate and extends in the first direction;
- forming a dummy gate on the substrate, wherein the dummy gate extends in the second direction and surrounds the nanowire/nanosheet defining layer; and
- patterning the nanowire/nanosheet defining layer by using the dummy gate as a mask.

15. The method according to claim 14 further comprising:
- forming a spacer on a sidewall of the dummy gate, wherein the first source/drain layer and the second source/drain layer are formed after the spacer is formed; and
- removing the dummy gate, wherein the nanowire/nanosheet defining layer is patterned after the dummy gate is removed, and the gate stack is formed in a space left on an inner side of the spacer by a removal of the dummy gate.

16. The method according to claim 14 wherein the forming the nanowire/nanosheet defining layer comprises:
- forming an isolation portion defining layer on the substrate; and
- forming a stack of one or more gate defining layers and one or more nanowire/sheet defining layers alternately arranged on the isolation portion defining layer; and
- patterning the stack and the isolation portion defining layer to extend in the first direction; and
- wherein the forming a dummy gate comprises:
- forming another gate defining layer on the substrate to cover the stack and the isolation portion defining layer;
- patterning the another gate defining layer into a strip shape extending in the second direction; and
- patterning the stack by using the another gate defining layer as a mask, wherein the gate defining layer and the another gate defining layer form the dummy gate.

* * * * *